(12) United States Patent
Miura

(10) Patent No.: US 10,955,093 B2
(45) Date of Patent: Mar. 23, 2021

(54) METHOD OF MANUFACTURING LIGHT EMITTING DEVICE

(71) Applicant: NICHIA CORPORATION, Anan (JP)

(72) Inventor: Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 2 days.

(21) Appl. No.: 16/230,565

(22) Filed: Dec. 21, 2018

(65) Prior Publication Data

US 2019/0195442 A1 Jun. 27, 2019

(30) Foreign Application Priority Data

Dec. 26, 2017 (JP) ................ JP2017-248617

(51) Int. Cl.
| | | |
|---|---|---|
| G02B 21/00 | (2006.01) | |
| G01N 21/64 | (2006.01) | |
| G01N 21/25 | (2006.01) | |
| F21K 9/90 | (2016.01) | |
| H01S 5/323 | (2006.01) | |
| F21V 11/16 | (2006.01) | |
| F21V 5/00 | (2018.01) | |
| H01S 5/40 | (2006.01) | |
| H01S 5/022 | (2021.01) | |
| H01S 5/00 | (2006.01) | |
| F21Y 115/30 | (2016.01) | |

(52) U.S. Cl.
CPC ........... *F21K 9/90* (2013.01); *F21V 5/007* (2013.01); *F21V 11/16* (2013.01); *H01S 5/005* (2013.01); *H01S 5/02288* (2013.01); *H01S 5/32316* (2013.01); *H01S 5/32341* (2013.01); *H01S 5/4075* (2013.01); *F21Y 2115/30* (2016.08); *H01S 5/02292* (2013.01); *H01S 5/02296* (2013.01); *H01S 5/4093* (2013.01)

(58) Field of Classification Search
CPC .............. G03F 7/70275; G03F 7/7035; G03F 7/70191; G03F 7/70466
See application file for complete search history.

(56) References Cited

U.S. PATENT DOCUMENTS

| | | | | |
|---|---|---|---|---|
| 2003/0151730 | A1* | 8/2003 | Shinoda | G03F 7/70075 355/69 |
| 2014/0307245 | A1* | 10/2014 | Tanaka | G03F 7/70566 355/71 |
| 2017/0207606 | A1* | 7/2017 | Nakanishi | H01S 5/02292 |

FOREIGN PATENT DOCUMENTS

| | | |
|---|---|---|
| JP | S59-18913 A | 1/1984 |
| JP | H01-232541 A | 9/1989 |
| JP | H10-209502 A | 8/1998 |

(Continued)

*Primary Examiner* — Brian Turner
(74) *Attorney, Agent, or Firm* — Foley & Lardner LLP

(57) ABSTRACT

A method of manufacturing a light emitting device includes: providing a light source including one or more semiconductor laser elements, an optical member including one or more lens parts, a condensing lens, and a photodetector, one above the other; causing at least one semiconductor laser element to emit light; determining a reference detection position of light; placing a first light-shielding member to shield a portion of the light passed through the lens parts; determining a post-shielding detection position; adjusting a distance between the light source and the optical member based on the reference detection position and the post-shielding detection position; and securing the optical member and the light source to each other.

14 Claims, 26 Drawing Sheets

(56) References Cited

FOREIGN PATENT DOCUMENTS

| | | | |
|---|---|---|---|
| JP | 2008-262125 | A | 10/2008 |
| JP | 2010-103323 | A | 5/2010 |
| JP | 2017-201684 | A | 11/2017 |

\* cited by examiner

FIG. 5
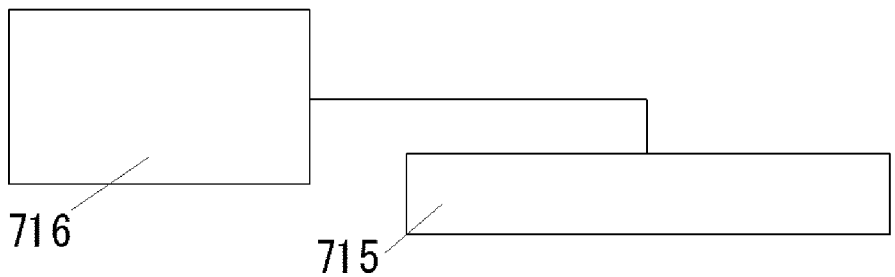
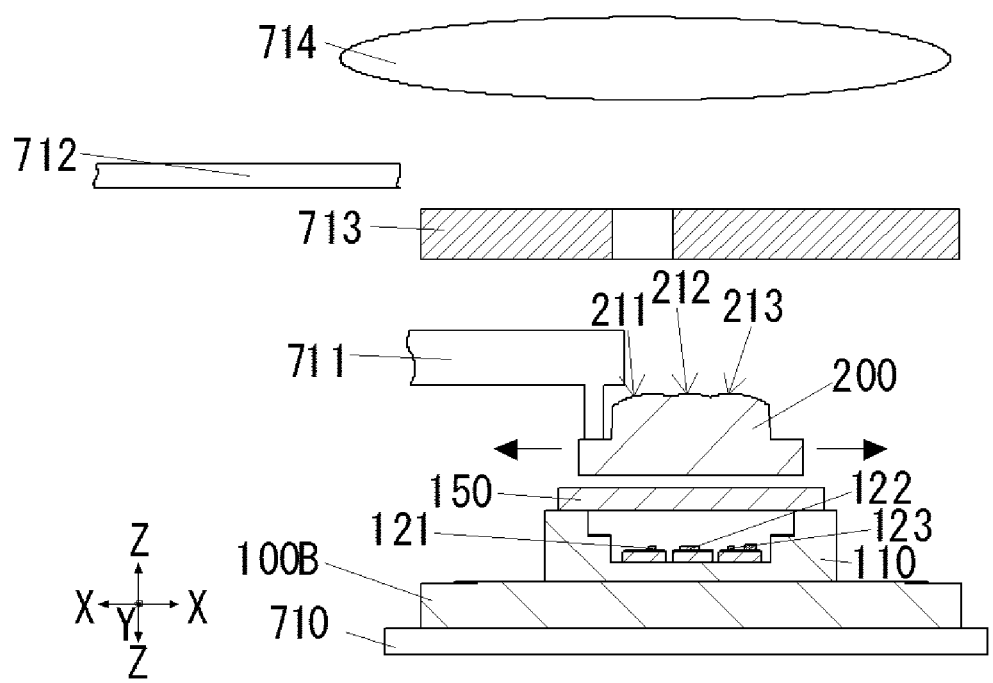

FIG. 6A
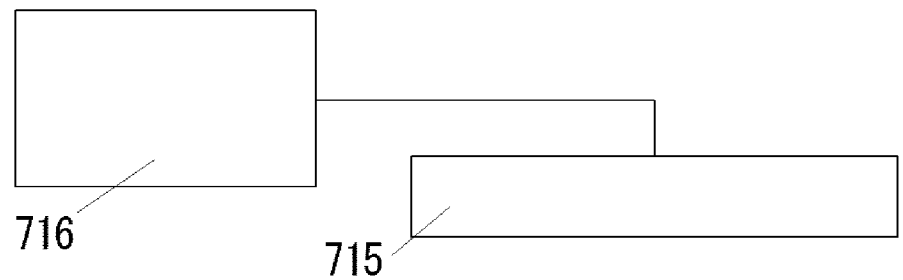
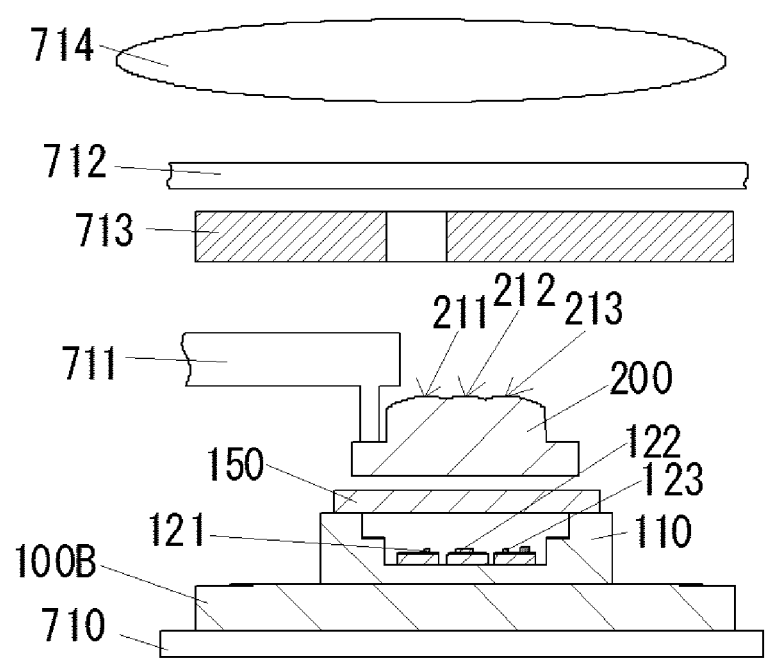

FIG. 7
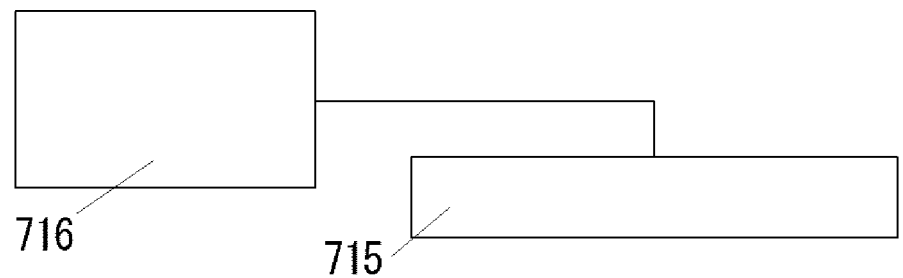
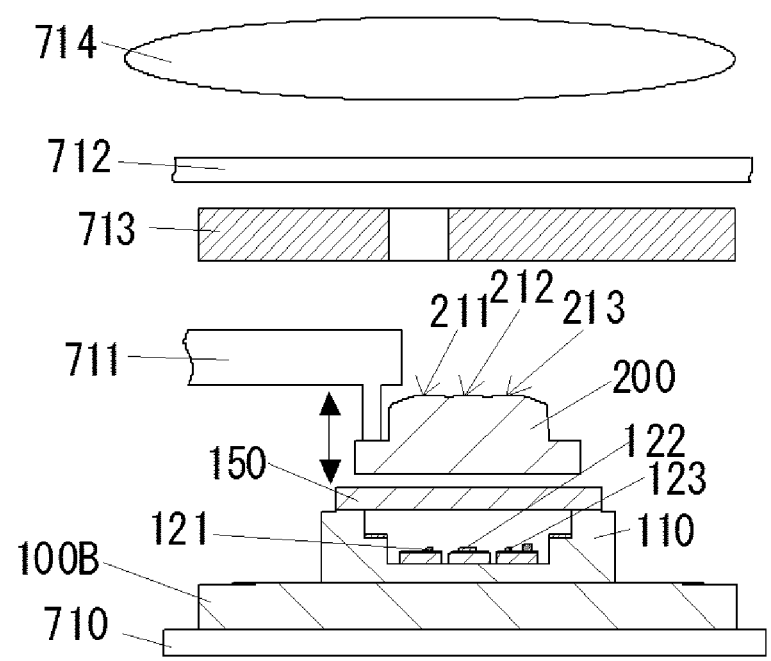

FIG. 8
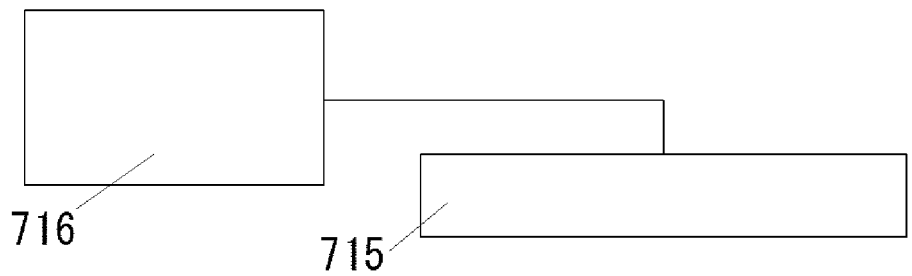
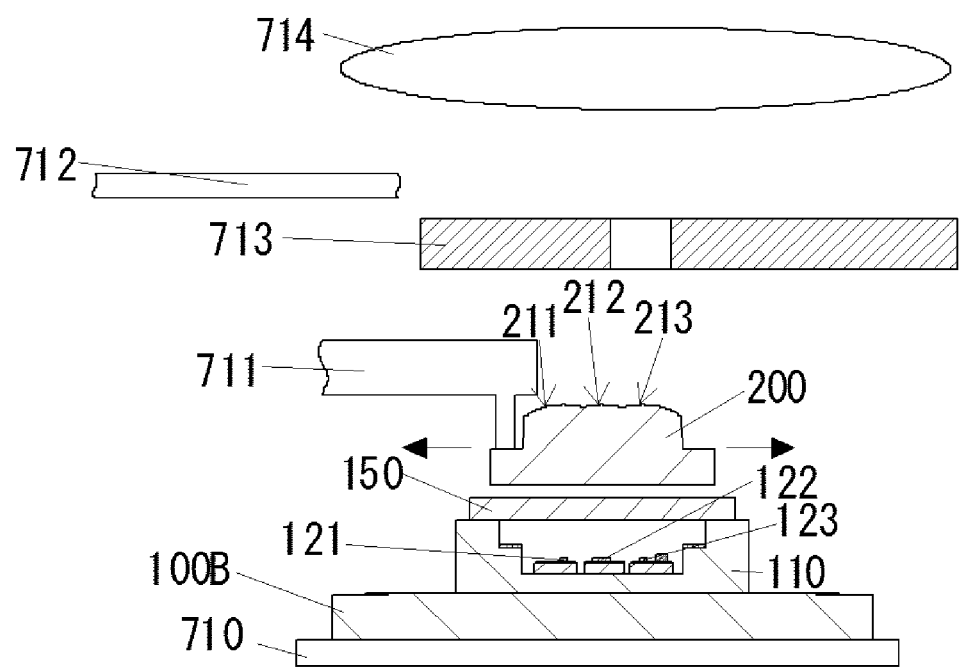

FIG. 9
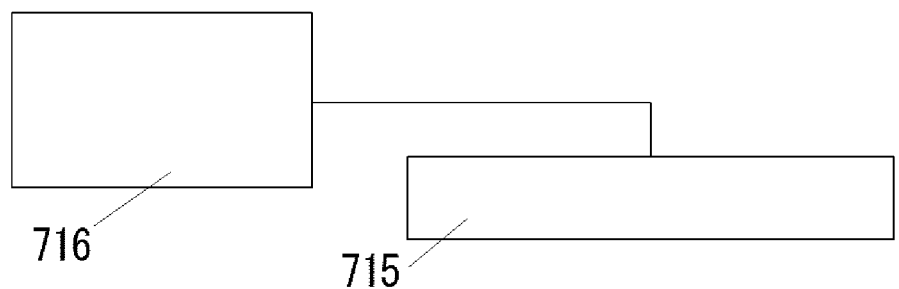
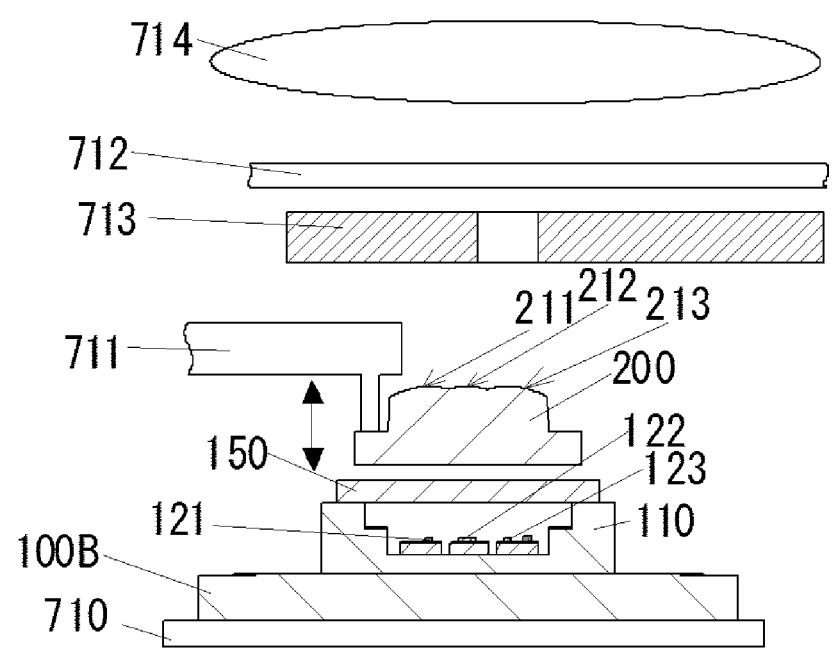

FIG. 10
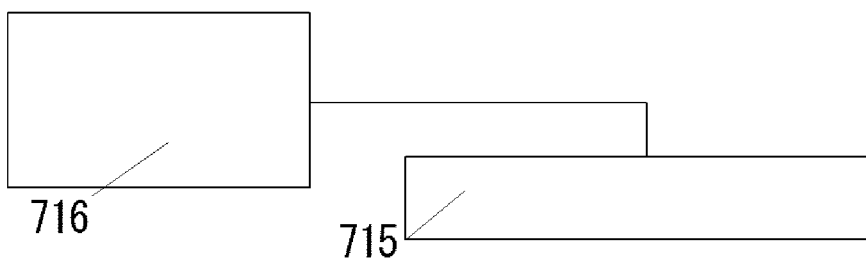
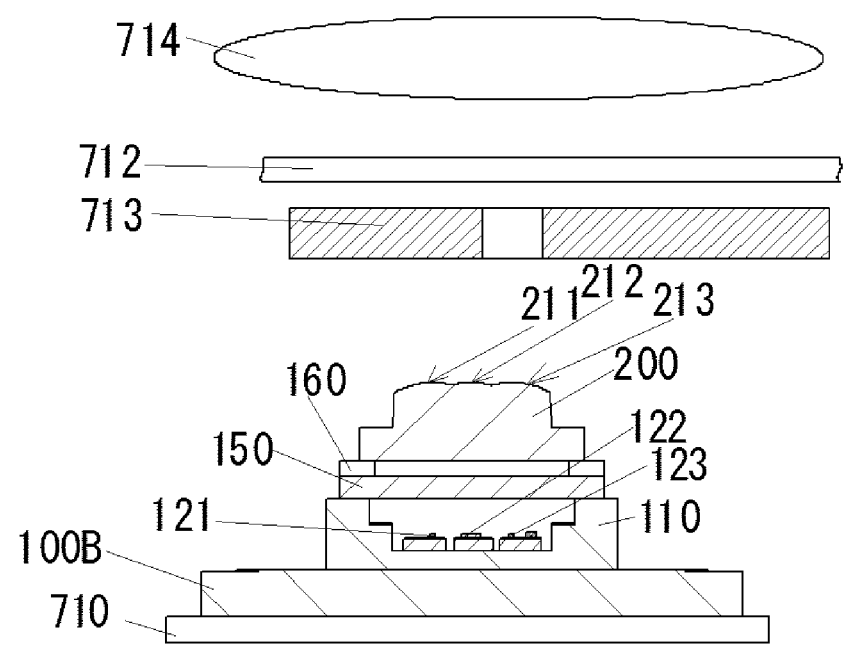

FIG. 21
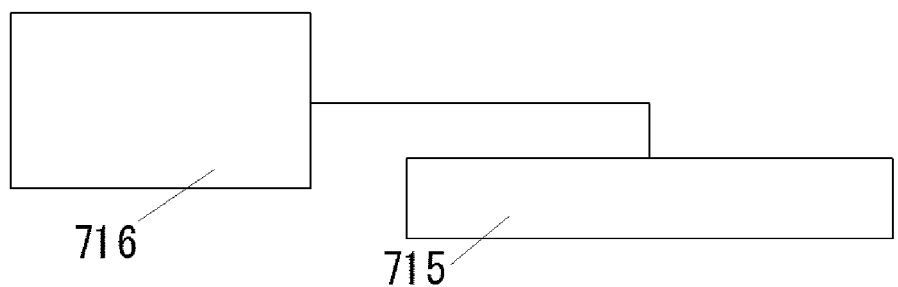
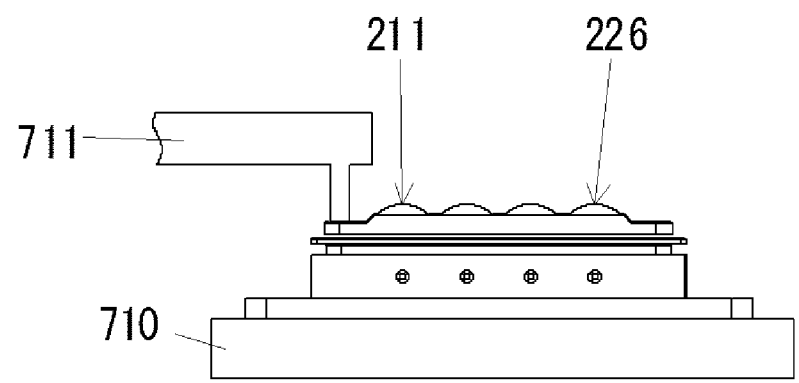

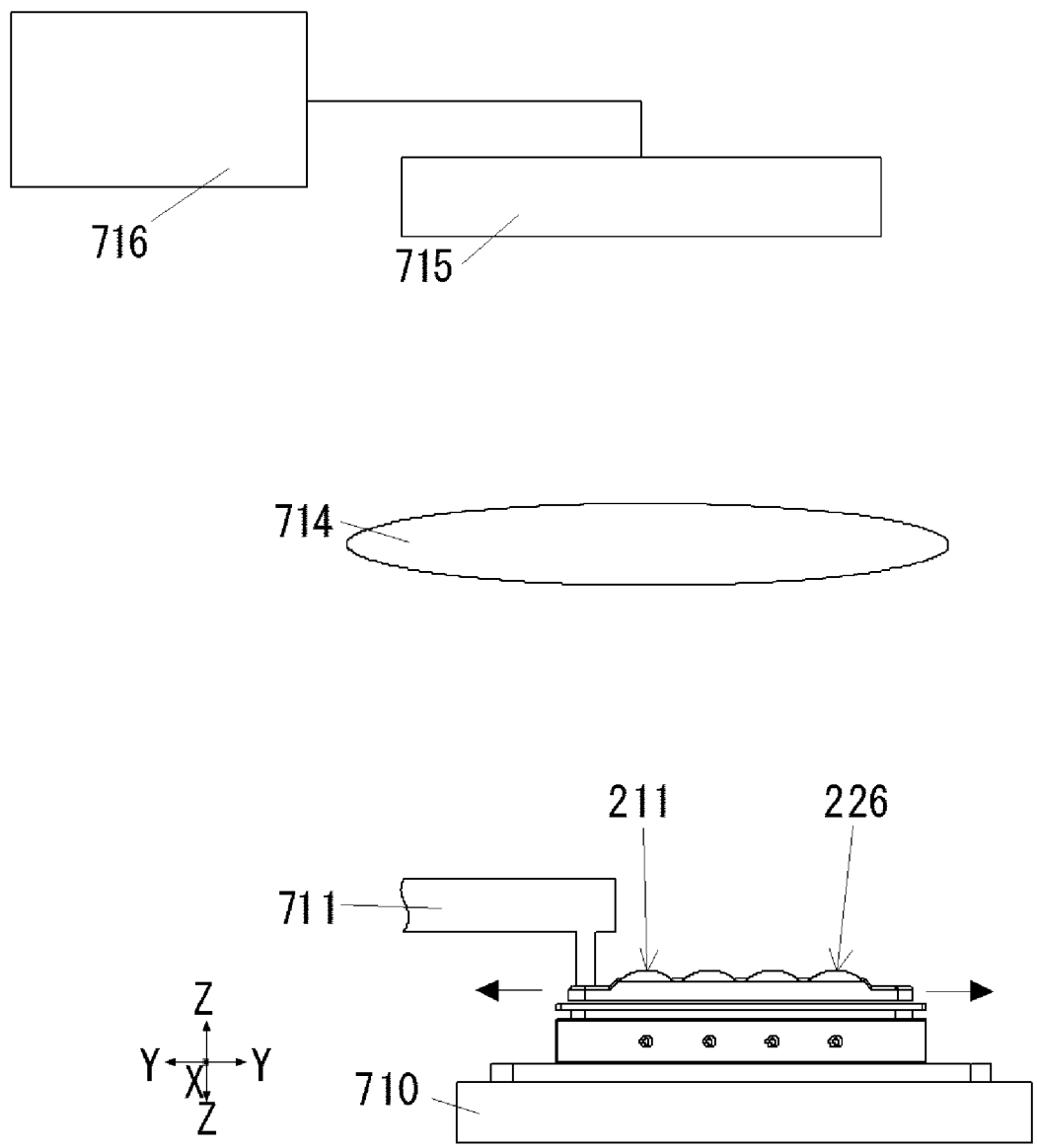

FIG. 23A
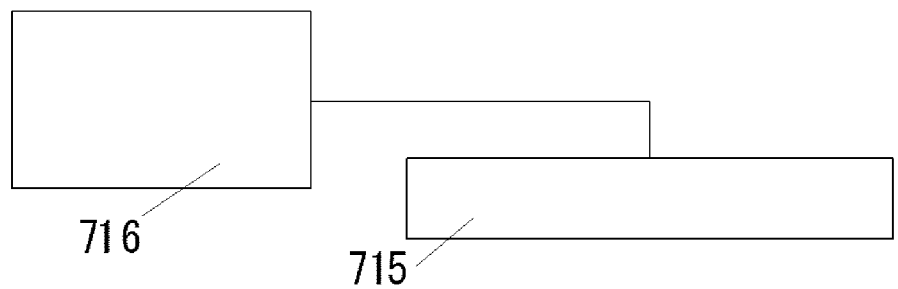
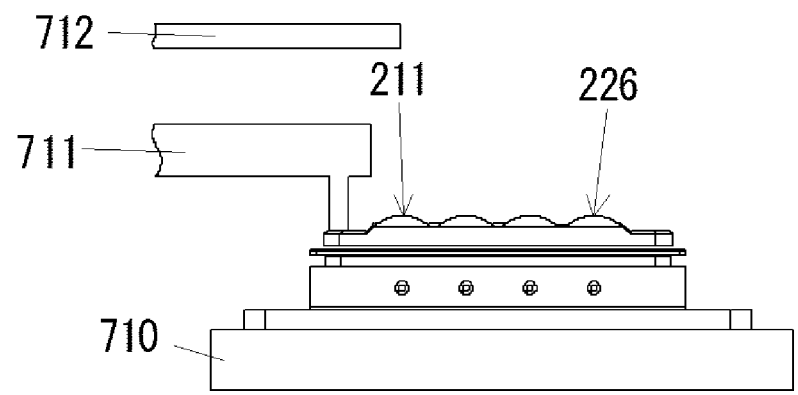

FIG. 25
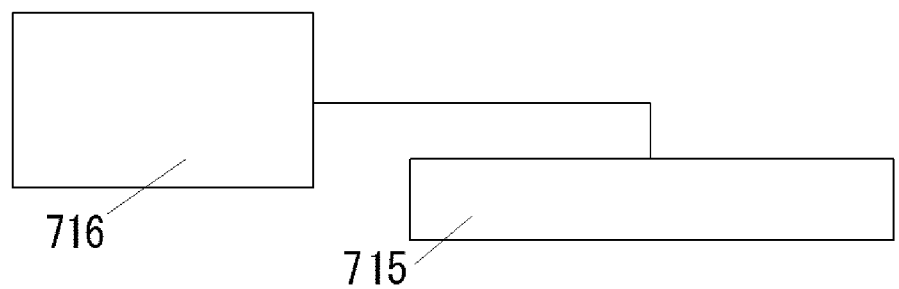
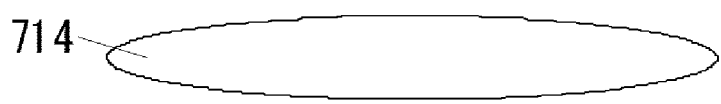
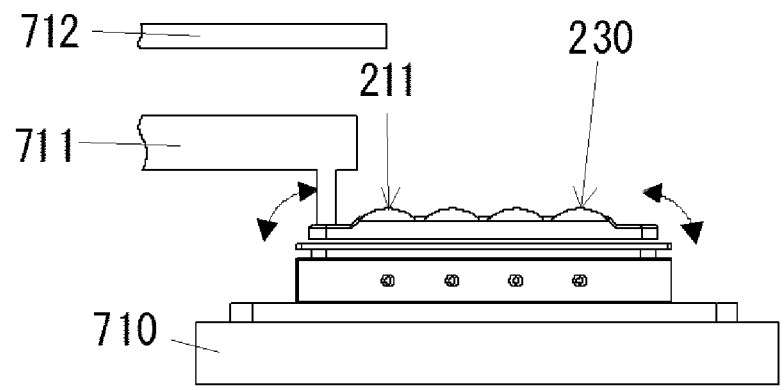

FIG. 26
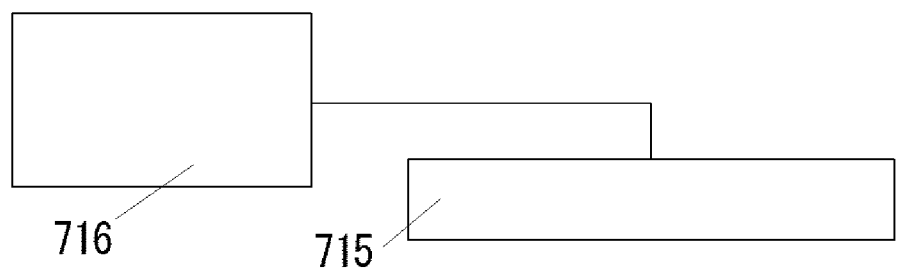
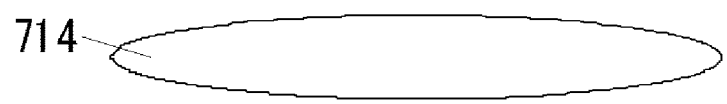
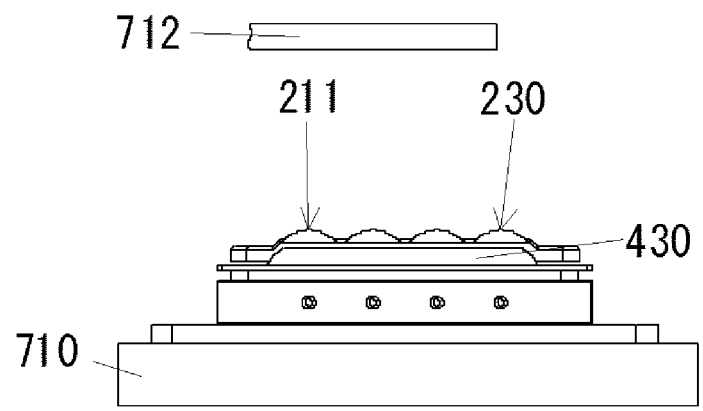

METHOD OF MANUFACTURING LIGHT EMITTING DEVICE

CROSS-REFERENCE TO RELATED PATENT APPLICATION

The present application claims priority under 35 U. S. C. § 119 to Japanese Patent Application No. 2017-248617, filed Dec. 26, 2017. The contents of this application are incorporated herein by reference in their entirety.

BACKGROUND

The present disclosure relates to a method of manufacturing a light emitting device.

A known light emitting device includes a light source and a collimating lens secured to the light source, for example, as illustrated in FIG. 3 of Japanese Unexamined Patent Application Publication No. 2010-103323. In such a light emitting device, correction of the position of the collimating lens may be performed such that the positions of beams are adjusted while continuously shifting the collimating lens in X-Y direction (planar direction) and the divergence angles of the beams are adjusted while continuously shifting the collimating lens in Z-direction (height direction).

SUMMARY

In such a light emitting device, there has been room for further improvement in efficient correction of the position of the collimating lens.

A method of manufacturing a light emitting device comprises: providing a light source comprising one or more semiconductor laser elements configured to emit light, the one or more semiconductor laser elements including a first semiconductor laser element; locating an optical member above the light source, the optical member comprising one or more lens parts, each corresponding to a respective one of the one or more semiconductor laser elements, the one or more lens parts including a first lens part corresponding to the first semiconductor laser element; locating a condensing lens above the optical member; locating a photodetector above the optical member; causing at least the first semiconductor laser element to emit light; detecting, using the photodetector, light that has been emitted from the first semiconductor laser element and that has passed through the first lens part and the condensing lens; determining a reference detection position of the light detected by the photodetector; locating a first light-shielding member between the optical member and the condensing lens; shielding, by the first light-shielding member, a portion of light that has passed through the first lens part; detecting, using the photodetector, a remaining portion of light that has passed through the first lens part, the light-shielding member, and the condensing lens; and determining a post-shielding detection position of the remaining portion of light detected by the photodetector; based on the reference detection position and the post-shielding detection position, adjusting a distance between the light source and the optical member such that, when the remaining portion of light is detected by the photodetector to obtain a third detection position, the third detection position approaches or coincides with the reference detection position; and securing the optical member and the light source to each other.

BRIEF DESCRIPTION OF THE DRAWINGS

FIG. 5 is a diagram illustrating a method of manufacturing a light emitting device according to the first embodiment.

FIG. 6A is a diagram illustrating a method of manufacturing a light emitting device according to the first embodiment.

FIG. 7 is a diagram illustrating a method of manufacturing a light emitting device according to the first embodiment.

FIG. 8 is a diagram illustrating a method of manufacturing a light emitting device according to the first embodiment.

FIG. 9 is a diagram illustrating a method of manufacturing a light emitting device according to the first embodiment.

FIG. 10 is a diagram illustrating a method of manufacturing a light emitting device according to the first embodiment.

FIG. 21 is a diagram illustrating a method of manufacturing a light emitting device according to the second embodiment.

FIG. 22 is a diagram illustrating a method of manufacturing a light emitting device according to the second embodiment.

FIG. 23A is a diagram illustrating a method of manufacturing a light emitting device according to the second embodiment.

FIG. 25 is a diagram illustrating a method of manufacturing a light emitting device according to the second embodiment.

FIG. 26 is a diagram illustrating a method of manufacturing a light emitting device according to the second embodiment.

DETAILED DESCRIPTION

Certain embodiments of the present invention will be described below with reference to the accompanying drawings. The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation. In the present specification, the light extracting surface side of the light emitting devices 300 and 600 (upper side in FIG. 4, and upper side in FIG. 21) will be referred to as an "upper side" and its opposite side (lower side in FIG. 4, and lower side in FIG. 21) will be referred to as a "lower side".

First Embodiment

Figure 1:
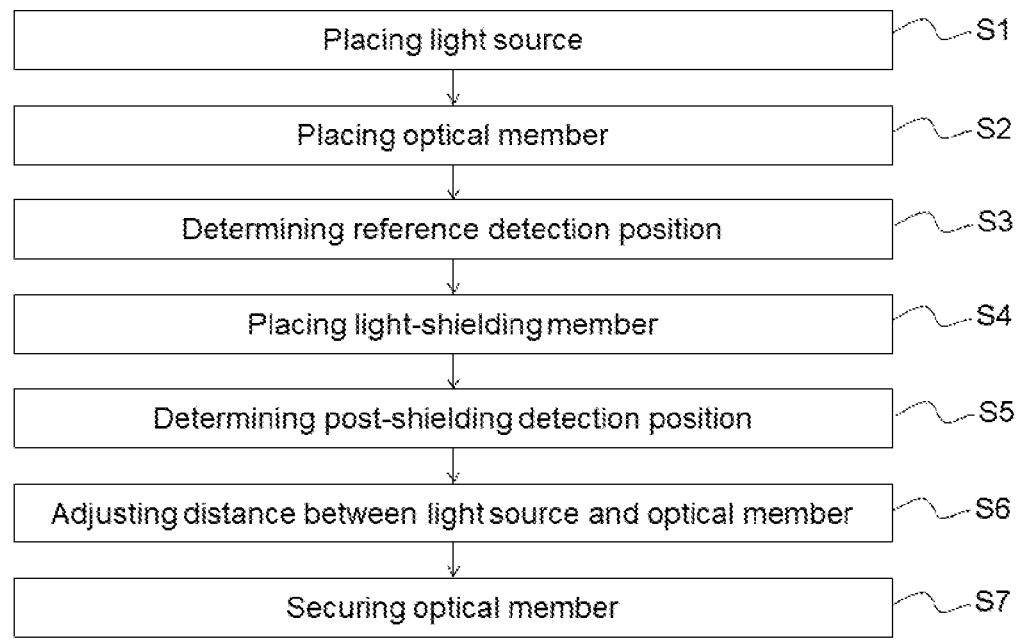
FIG. 1 is a flowchart illustrating a method of manufacturing a light emitting device according to a first embodiment.
Figure 2:
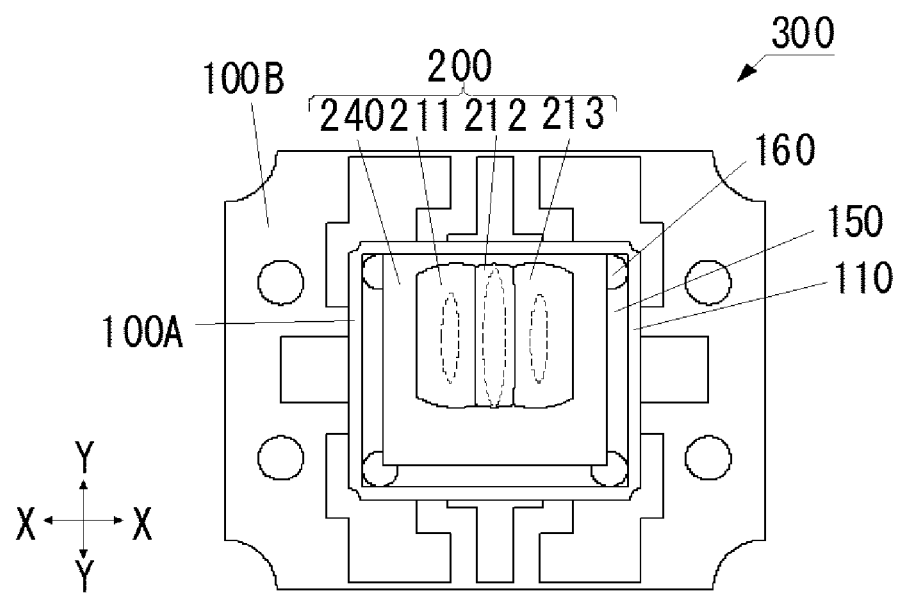
FIG. 2 is a schematic top view of a light emitting device obtained by a method of manufacturing according to the first embodiment.
Figure 3:
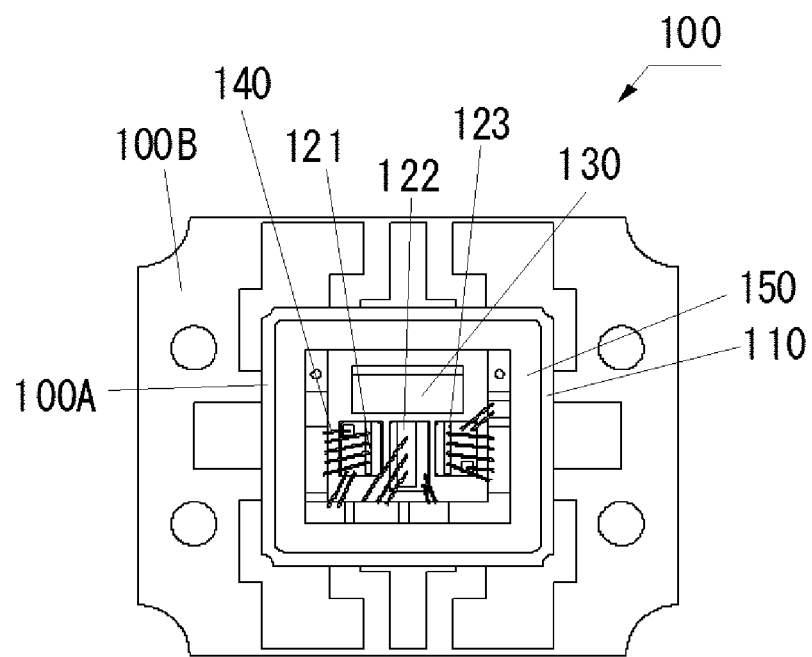
FIG. 3 is a schematic view illustrating constituent components in a recess of a base of the light emitting device shown in FIG. 2.

FIG. 1 is a flowchart illustrating a method of manufacturing a light emitting device 300 according to a first embodiment, FIG. 2 is a schematic top view of the light emitting device 300, and FIG. 3 is a top view of a light source 100 of the light emitting device 300. In FIG. 3, the cover 150 is shown as transparent to clarify the configuration of the components disposed in the recess of a base 110 included in the light source 100. FIG. 4 to FIG. 10 are diagrams illustrating a method of manufacturing the light emitting device 300.

As shown in FIG. 4 to FIG. 10, the method of manufacturing the light emitting device 300 includes the steps, in this order, of:
(S1): providing the light source 100 including one or more semiconductor laser elements, including a first semiconductor laser element, each being configured to emit light, and placing the light source 100 on or above a stage 710;
(S2): locating an optical member 200 including one or more lens parts, inclusive of a first lens part, each corresponding to a respective one of the one or more semiconductor laser elements, above the light source 100;
(S3): causing at least the first semiconductor laser elements to emit light,
detecting, using a photodetector 715, light emitted from the first semiconductor laser element and passed through the first lens part corresponding to the first semiconductor laser element, and passed through the condensing lens 714, in this order, to obtain a first detection position, and determining the first detection position of the light acquired by the photodetector 715, as a reference detection position;
(S4): placing a first light-shielding member 712 between the optical member 200 and the condensing lens 712;
(S5): shielding, by the first light-shielding member 712, a portion of the light passed through the first lens part; detecting, using the photodetector 715, a remaining portion of light passed through the first lens part and passed through the condensing lens, to obtain a second detection position; and determining the second detection position acquired by the photodetector 715, as a post-shielding detection position;
(S6): based on the reference detection position and the post-shielding detection position, adjusting a distance between the light source 100 and the optical member 200 such that when the remaining portion of light is detected by the photodetector 715 to obtain a third detection position, the third detection position approaches or coincides with the reference detection position; and
(S7): securing the optical member 200 directly above the light source 100.

In the method of manufacturing the light emitting device 300 according to the first embodiment, a divergence angle of light emitted from the light source 100 and passed through the optical member 200 can be adjusted to a desired angle in a relatively short time. Details will be described below.

There may be a mounting error and/or a dimensional tolerance of each component that requires an adjustment. For example, in order to produce collimated light or substantially collimated light after passing through the optical member, a distance between the light source and the optical member (hereinafter may be referred to as a "height of the optical member") should be adjusted for each light emitting device. In order to adjust the distance between the light source and the optical member, the height of the optical member may be adjusted, which may be achieved by performing a step of causing at least one of the one or more semiconductor laser elements to emit light, and detecting, using the photodetector, light that has passed through corresponding one of the one or more lens parts, and measuring luminance of the detected light acquired by the photodetector, for a plural number of times, while changing the height of the optical element to determine an adjustment amount of the height of the optical member. Such an adjustment requires a plural number of times of measurements using the photodetector, which is time-consuming for adjustment of the height of the optical member.

To cope with is, in a method of manufacturing a light emitting device 300, position of light is determined such that, using the first light-shielding member 712, a portion of light that has passed through the corresponding one of the one or more lens parts is shielded and a remaining portion of light that is not shielded by the first light-shielding member 712 is detected by the photodetector 715, and determined as a post-shielding detection position. Based on the amount of positional deviation between the reference detection position, which is obtained without shielding a portion of the light, and the post-shielding detection position, the height of the optical member is adjusted. With this method, an amount of positional adjustment of the optical member in up direction or down direction can be directly determined from the amount of deviation thus obtained, accordingly, adjustment of the height of the optical member can be performed in a relatively short time.

The method of manufacturing a light emitting device 300 will be described below.

Providing Light Source 100

As shown in FIG. 3, a light source 100 including one or more semiconductor laser elements, each being configured to emit a light, is provided. In the example shown in FIG. 3, the light source 100 including three semiconductor laser elements is provided, but a light source including a single semiconductor laser element may also be employed. The light source 100 includes a package 100A mounted on an upper surface of a mounting substrate 100B. The package 100A may be disposed on the mounting substrate 100B by using a eutectic solder or the like, but thickness of the eutectic solder may vary when mounting the package 100A, which may result in deviation in the height of the respective light sources. Even with such a deviation in the height, the emission of light from the light source 100A that include a mounting substrate 100B and a package 100A mounted on the mounting substrate 100B can be adjusted in a desired direction with respect to the lower surface of the mounting substrate 100B, by placing the light source 100 on or above the stage 710 and adjusting the height (i.e., Z-direction) of the optical member 200. Although the light source 100 having the mounting substrate 100B is illustrated, the mounting substrate 100B may be omitted.

Figure 4:
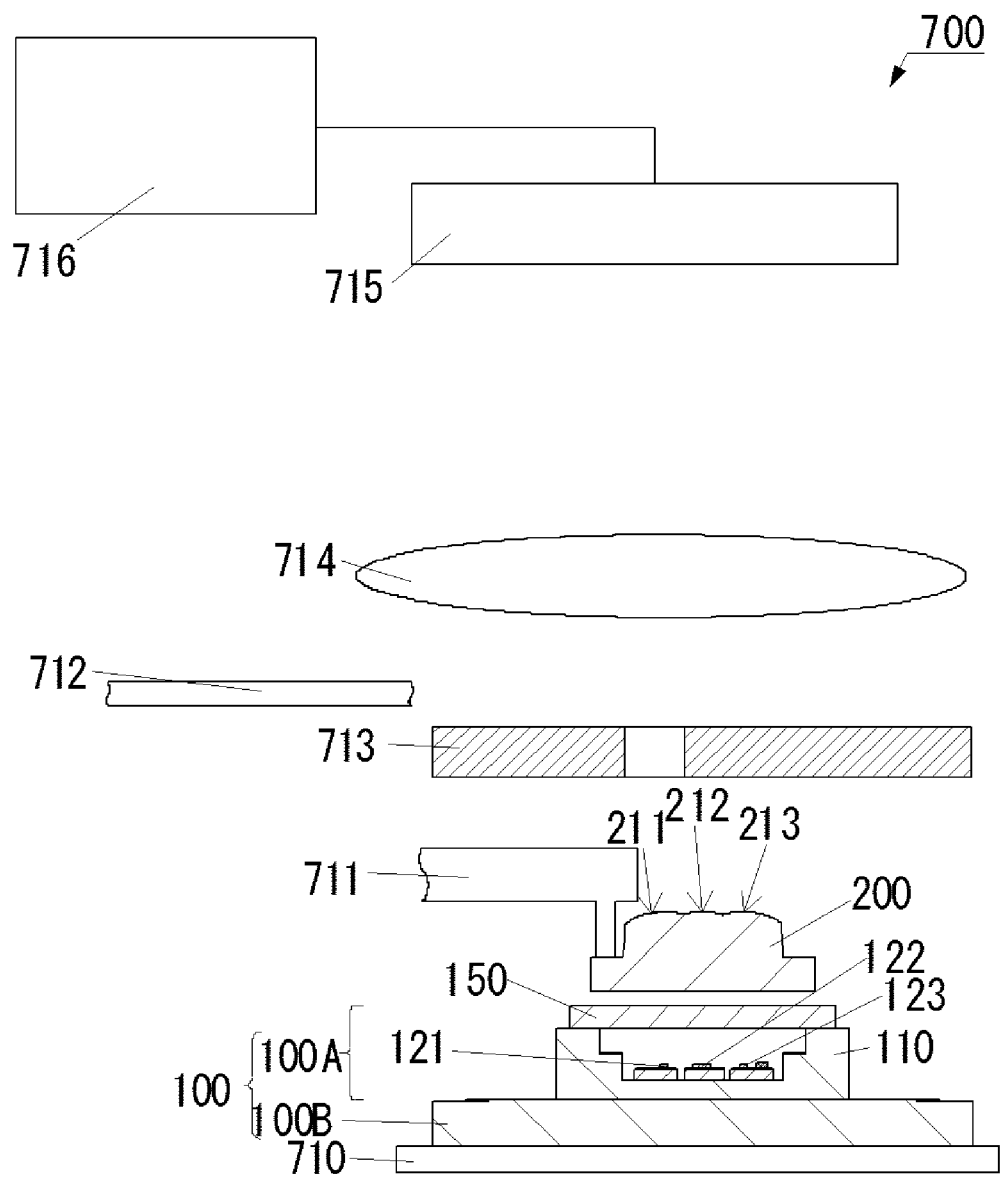
FIG. 4 is a diagram illustrating a method of manufacturing a light emitting device according to the first embodiment.

As shown in FIG. 3 and FIG. 4, the package 100A can include a base 110 formed with an upward facing recess, one or more semiconductor laser elements 121, 122, and 123 disposed on a first upward-facing surface of the recess, a light-reflecting part 130 disposed on the first upward surface of the recess, and a cover 150 having a light-transmissive part and secured on an upper surface of the base 110 to cover the recess.

In the example shown in FIG. 3 and FIG. 4, the package 100A includes three semiconductor laser elements 121, 122, and 123 disposed laterally in a row. The three semiconductor laser elements are a first semiconductor laser element 121 configured to emit blue light, a second semiconductor laser element 122 configured to emit red light, and a third semiconductor laser element 123 configured to emit green light. The first semiconductor laser element 121 and the third semiconductor laser element 123 each include a GaN-based semiconductor that is a nitride semiconductor, and the second semiconductor laser element 122 includes a GaAs-based semiconductor. The first semiconductor laser element 121 and the third semiconductor laser element 123 respectively have a single light-emitting point, and the second semiconductor laser element 122 has two light-emitting points. But, the material, the number of light-emitting points, etc., of each semiconductor laser element may be determined appropriately.

The light-reflecting part 130 is configured to reflect light from the semiconductor laser element to upward. The light-reflecting part 130 may be formed of glass on which a metal film or/and a dielectric multilayer film are provided. With the light-reflecting part 130, the optical path length between the light-emitting end-surface of each semiconductor laser element and the light incidence surface (lower surface) of the optical member 200 can be increased. When the deviation between the optical axis of light reflected by the light-reflecting part 130 and the corresponding lens part is at a specific range, the increase in the optical path length allows for a reduction of deviation in the propagating direction of light after passing through the corresponding lens part, compared to a case with a shorter optical path length.

The cover 150 is made of sapphire. Because sapphire is a material having a relatively high transmittance and a relatively high hardness, light from each of the semiconductor laser elements can be easily transmitted and the possibility of damage of the cover 150 can be reduced. The cover 150 and the base 110 are bonded by using a eutectic solder made of Au—Sn or other suitable bonding material. When a semiconductor laser element containing a nitride semiconductor is used, a space defined by the base 110 and the cover 150 is preferably a hermetically sealed space to prevent or reduce attracting dust to the semiconductor laser element. Other than sapphire, the cover 150 may be made of a material having light-transmissive property such as glass. The cover 150 may include a light-transmissive part made of a light-transmissive material and a supporting part made of a material such as a metal. When the cover 150 is formed with a supporting part made of a metal and a light-transmissive part, a region of the base 110 to which the supporting part of the cover 150 is secured is made of a metal.

Each semiconductor laser element is electrically connected to the base 110 by wires 140. The base 110 includes wirings corresponding to respective semiconductor laser elements, and each wiring reaches the upper surface and the lower surface of the base 110. The lower surface of the base 110 is electrically connected to the mounting substrate 100B. In the first embodiment, a plurality of wirings are provided such that each of the semiconductor laser elements can be individually caused to emit light.

Placing Light Source 100 on or above Stage 710: S1

Next, as shown in FIG. 4, the light source 100 is placed on or above the stage 710 included in an optical measuring system 700. The optical measuring system 700 includes the stage 710, a support 711 which allows for positional adjustment of the optical member 200 that is placed above the light source 100, a first light-shielding member 712 provided to shield a portion of light that has passed through the corresponding lens part, a condensing lens 714 located above the shielding member 712, a photodetector 715 provided to detect a portion of light that has passed through corresponding lens part 714 and the condensing lens 714, which is not shielded by the first light-shielding member 712, and an analyzing device 716 to determine a detection position of light acquired by the photodetector 715. For a system including the stage 710, the support 711, the condensing lens 714, the photodetector 715, and the analyzing device 716, for example, an auto collimator can be used. In the first embodiment, the optical measuring system 700 includes a second light-shielding member 713 between the support 711 and the condensing lens 714. The second light-shielding member 713 is formed with a through-opening to allow passage of light that has passed through a single lens part. As described below, when light from a semiconductor laser element has a divergence to some degree, stray light likely occurs. Thus, measuring light may be affected by light other than light that has passed through the corresponding one or more lens parts. But with the second light-shielding member 713 placed at a predetermined position, more precise measuring of light that has passed through a single lens part can be performed.

In the step of placing the light source 100 on the stage 710, the first light-shielding member 712 is placed so as not to located directly above the light source 100.

Placing Optical Member: 200 Above Light Source 100: S2

Next, as shown in FIG. 4, an optical member 200 including one or more lens parts is placed above the light source 100. For the optical member 200, for example, a collimating lens can be used. In the present specification, either a collimating lens that converts light that has passed through the lens parts into collimated light or a collimating lens that converts light that has passed through the lens parts into substantially collimated light can be employed. For the optical member 200, for example, a glass known as B270, BK7 (borosilicate glass), or the like, manufactured by SCHOTT may be used. The optical member 200 preferably includes the number of lens parts corresponding to the number of the semiconductor laser elements included in the light source 100. In the first embodiment, the optical member 200 including one or more lens parts has a first lens part 211 to allow light from the first semiconductor laser element 121 to pass through, a second lens part 212 to allow light from the second semiconductor laser element 122 to pass through, and a third lens part 213 to allow light from the third semiconductor laser element 123 to pass through, arranged in a single row. As shown in FIG. 2, each lens part is formed as a distinct convex portion of the optical member. Further, as shown in FIG. 2, the lens parts are disposed connected to one another in one direction. That is, each lens part is directly connected to an adjacent lens part, with no non-lens portions located between the lens parts.

The optical member 200 is, as shown in FIG. 2, preferably provided with a non-lens part 240 around the one or more lens parts in a top view. This arrangement allows for applying the adhesive 160 to the non-lens part 240 in the step of securing the optical member 200, thus, the optical member 200 can be fixed to the base 110 via the adhesive 160 applied on the non-lens part 240, such that light from the semiconductor laser element(s) can be prevented or impeded from reaching the adhesive 160. The non-lens part 240 can have a flat upper surface and a flat lower surface. The flat upper surface of the non-lens part 240 facilitates supporting of the optical member 200 by the support 711. Processing of the steps of placing the light source 100 on the stage 710 (S1) and placing the optical member 200 above the light source 100 (S2) may be performed in reversed order. That is, after placing the optical member 200, the light source 100 can be placed under the optical member 200.

Determining Reference Detection Position: S3

Next, one of the semiconductor laser elements is caused to emit light. The light that has been emitted from the semiconductor laser element and that has passed through the corresponding lens part and the condensing lens 714 is detected by the photodetector 715 to acquire a first detection position, which is a reference detection position. In the first embodiment, as shown in FIG. 5, the position of the lens part of the optical member 200 in a planar direction (X-direction and Y-direction, i.e., planar coordinates) is adjusted so that light from the first semiconductor laser element 121 passes through the center of the first lens part 211, and the reference detection position is determined at the adjusted position. This allows for a reduction of deviation of light in its propagating direction in the lens part, which can facilitate adjustment of the position of the lens part in Z-direction.

In the adjustment of the lens part of the optical member 200 in a planar direction, the lens part is adjusted so that light that has passed through the lens part propagates in a direction perpendicular to the lower surface of the base 110. Alternatively, without adjusting the position of the optical member 200 in a planar direction, the semiconductor laser element is caused to emit light, and the detection position acquired by the photodetector is used to determine the reference detection position.

In the first embodiment, a CCD image sensor equipped in the autocollimator is used as the photodetector 715, and the position of the light is determined based on the position of the light displayed on the display screen that displays data from the CCD image sensor. More specifically, allowing the light emitted from the first semiconductor laser element 121 to propagate, the light that passed the first lens part 211 and the condensing lens 714 in this order is detected and determine a detection position (position before adjustment) acquired by the CCD image sensor. If the position before adjustment is deviated from the predetermined value (i.e., predetermined coordinates), the position of the optical member 200 in a planar direction is adjusted so that the detection position of the light acquired by the photodetector 715 matches the predetermined position. Then, the predetermined position after adjustment obtained by the adjustment is then determined as the reference detection position. When the adjustment of the position of the optical member 200 in the planar direction is not performed, the position of light displayed on the display screen is determined as the reference measurement position, and accordingly, a step of adjusting the distance between the optical member 200 and the light source 100, which will be described later below, will be performed. When the position before adjusting matches the predetermined position, adjustment of the optical member 200 in the planar direction is not performed. For the photodetector 715, other than the CCD sensor, an imaging element such as a CMOS image sensor can be used.

When a CCD image sensor equipped in an autocollimator is used as the photodetector 715, the range of light intensity that can be measured by the photodetector 715 is relatively narrow. In other words, if the intensity of light detected by the photodetector 715 is too high and exceeding the dynamic range of the photodetector 715, halation may result on the screen where measurement of the luminance distribution may be impossible. If the intensity of light is too low, the light may not be detected by the photodetector 715. Also, due to variation in performance of the semiconductor laser elements, detection of the luminance intensity with a fixed electric current value may not be possible. Accordingly, in the first embodiment, an electric current below the detection threshold is applied and measuring is performed by slightly increasing the electric current value to a measurable value. For example, measuring is performed while applying electric current in a range of 5 mA to 300 mA. Supplying the electric current of equal to or higher than the minimum value in the range shown above can facilitate detection of position of light by the photodetector 715 and supplying the electric current of equal to or higher than the maximum value in the range shown above can prevent exceeding the measurable range of luminance. When the autocollimator is used for measuring, a neutral-density (ND) filter may be provided to the photodetector 715 and the semiconductor laser element is allowed to oscillate to emit a laser light to determine the reference detection position. If the photodetector 715 can withstand a high light intensity, electric current greater than the threshold current may be applied in measuring.

When the semiconductor laser elements are caused to emit light with an electric value lower than the threshold current, as shown in the present embodiment, it is particularly preferable that the second light-shielding member 713 is placed. When the semiconductor laser elements are caused to emit light with an electric value lower than the threshold current, divergence of light passing through the lens part tend to increase and stray light likely occurs, but the effect of stray light can be reduced to some degree by placing the second light-shielding member 713, which facilitates accurate adjustment of the height of the optical member 200.

When the light source 100 includes a plurality of semiconductor laser elements, it is preferable to allow passage of light from only the semiconductor laser element to be measured, as described above. Accordingly, detection of light emitted from adjacent semiconductor laser element(s) can be reduced or prevented. However, passage of all the plurality of semiconductor laser elements, or passage of a plurality of semiconductor laser elements connected in series may be allowed, in the measurement. In such a case, effect of shielding of light by the second light-shielding member 713 can be more remarkably attained.

Placing First Light-Shielding Member 712: S4

Figure 6B:
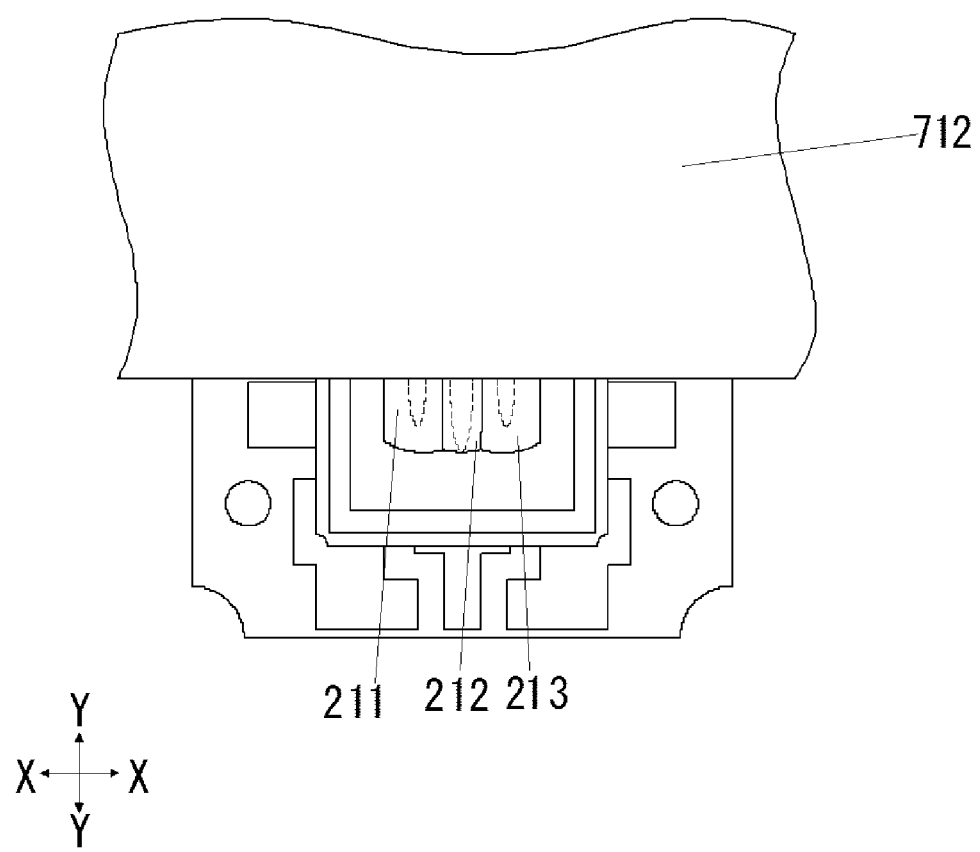
FIG. 6B illustrates a light source, an optical member, and s first light-shielding member shown in FIG. 6A, viewed from above.

Next, as shown in FIG. 6A, a first light-shielding member 712 is placed between the optical member 200 and a condensing lens 714. That is, the first light-shielding member 712 is placed above the light source 100 to cover a portion of the light source 100. As shown in the top view in FIG. 6B, the first light-shielding member 712 is preferably placed such that a half or greater amount of light that has passed through its corresponding lens part is shielded. With this arrangement, measuring of a deviation from a predetermined divergence angle can be facilitated in the step (S5) of adjusting the distance between the light source and the optical member, which will be described later below. Accordingly, in the step (S6) of adjusting the distance between the light source and the optical member, higher accuracy in correcting the position of the lens part of the optical member 200 can be obtained. For the first light-shielding member 712, a metal material such as aluminum can be used. The first light-shielding member 712 can be formed with an appropriate shape that can shield a portion of light that has passed through the condensing lens 714. In FIG. 6B, for the sake of easy understanding, the second light-shielding member 713 and the second protective layer 711 are not shown.

Determining Post-Shielding Detection Position: S5

Next, as shown in FIG. 6A and FIG. 6B, a portion of light that has been emitted from the semiconductor laser element and that has passed through the lens part is shielded by the first light-shielding member 712, and another portion of light that has been emitted from the semiconductor laser element and that has passed through the lens part and the condensing lens 714 is detected by the photodetector 715, and a detection position acquired by the photodetector 715 is determined, as the first light-shielding position. In the first embodiment, the post-shielding detection position is the location of the centroid (hereinafter may be referred to as "centroid of luminance") of the luminance distribution. Accordingly, more accurate adjusting of the height of the lens part can be obtained. Other than the position of the centroid of luminance, the position of a centroid of detection area of luminance may be used as the post-shielding detection position.

The position (coordinates) of the centroid of luminance is calculated for each pixel array in X-direction and Y-direction of data of light detected by photodetector 715. In a pixel array Y, the centroid of luminance in X-direction is calculated using the equation (a). In the equations (a) and (b), xi and yi denote the location of the i th pixel, Ki denotes the brightness value, and X and Y denote the position (coordinates) of the centroid of luminance.

$$X=(\Sigma(K_i \times x_i)/\Sigma K_i) \quad (a)$$

The centroid of luminance in X-direction obtained from the equation is averaged in Y-direction to obtain X-coordinate of the centroid of luminance. Similarly, the centroid of luminance in Y-direction is calculated using the equation (b).

$$Y=(\Sigma(K_i \times y_i)/\Sigma K_i) \quad (b)$$

The centroid of luminance in Y-direction obtained from the equation is averaged in X-direction to obtain Y-coordinate of the centroid of luminance.

Accordingly, the position of the centroid of luminance can be determined.

Other than the method described above, the post-shielding detection position can be determined by using other appropriate methods, for example, calculating as a centroid of luminance detection area using a simple binarization method for centroid calculation.

Figure 11:
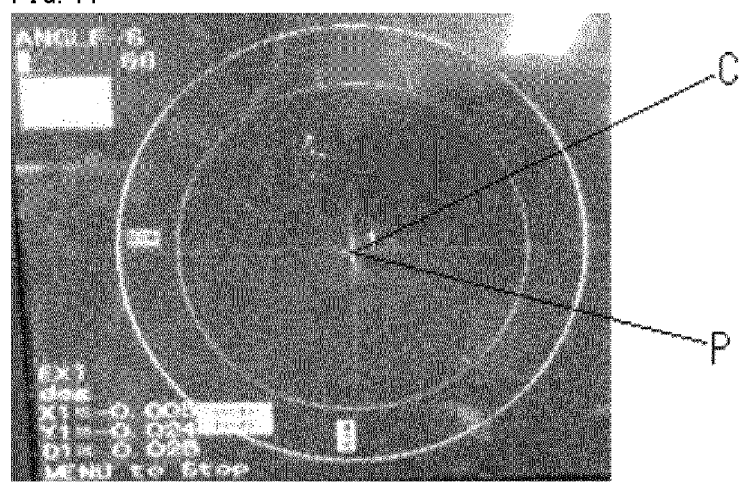
FIG. 11 is an image acquired by a photodetector, without using a first light-shielding member.
Figure 12:
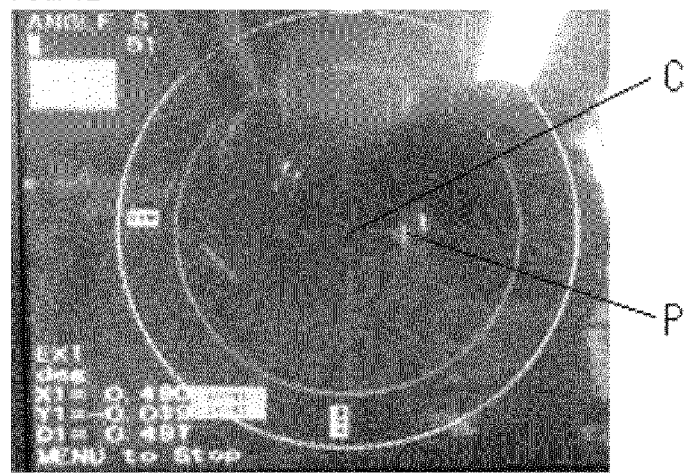
FIG. 12 is an image acquired by the photodetector, with using the first light-shielding member for the light emitting device measured in FIG. 11.

FIG. 11 shows a result of photographing the position of the centroid of luminance by using a CCD image sensor, without placing the first light-shielding member. FIG. 12 shows a result of photographing the position of the centroid of luminance by using a CCD image sensor, with placing the first light-shielding member. When the first light-shielding member was not placed, the center of light detected by the photodetector was at the predetermined position even the light passes through the lens part did not have a desired shape (in this case, collimated light). This is because a laser light generally has a Gaussian intensity distribution such that when the position in X-Y direction has been adjusted, the centroid of luminance is located at zero even with non-collimated light. Whereas, as shown in FIG. 12, placing the first light-shielding member allowed for confirming the presence of a deviation in the divergence angle. Even when the first light-shielding member 712 is placed, if the collimated light has been formed, the position of the centroid of luminance matches to the reference detection position C as shown in FIG. 11 and thus can be correctly recognized. As described above, with the method of manufacturing according to the present embodiment, a deviation in the divergence angle of light can be accurately detected, such that the distance between the optical member 200 and the light source 100 can be accurately adjusted.

Figure 13A:
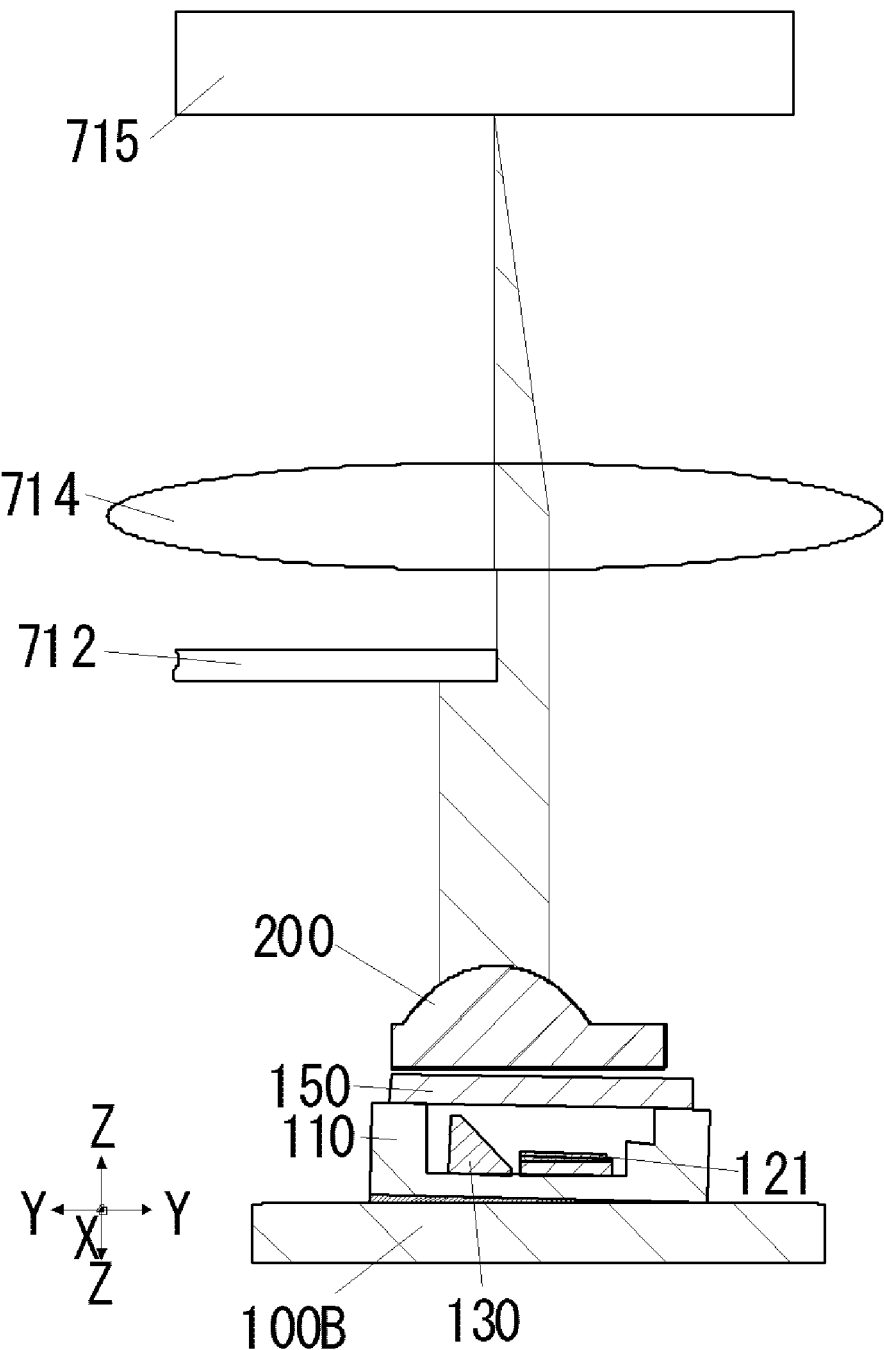
FIG. 13A is a diagram showing an optical path of light from a light emitting device in which a light source and an optical member have a desired distance.
Figure 13B:
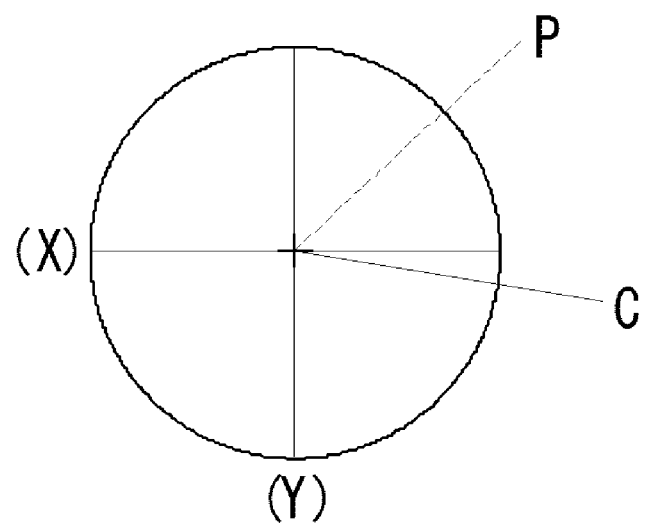
FIG. 13B is a schematic diagram of an image of light shown in FIG. 13A, acquired by a CCD image sensor.
Figure 14A:
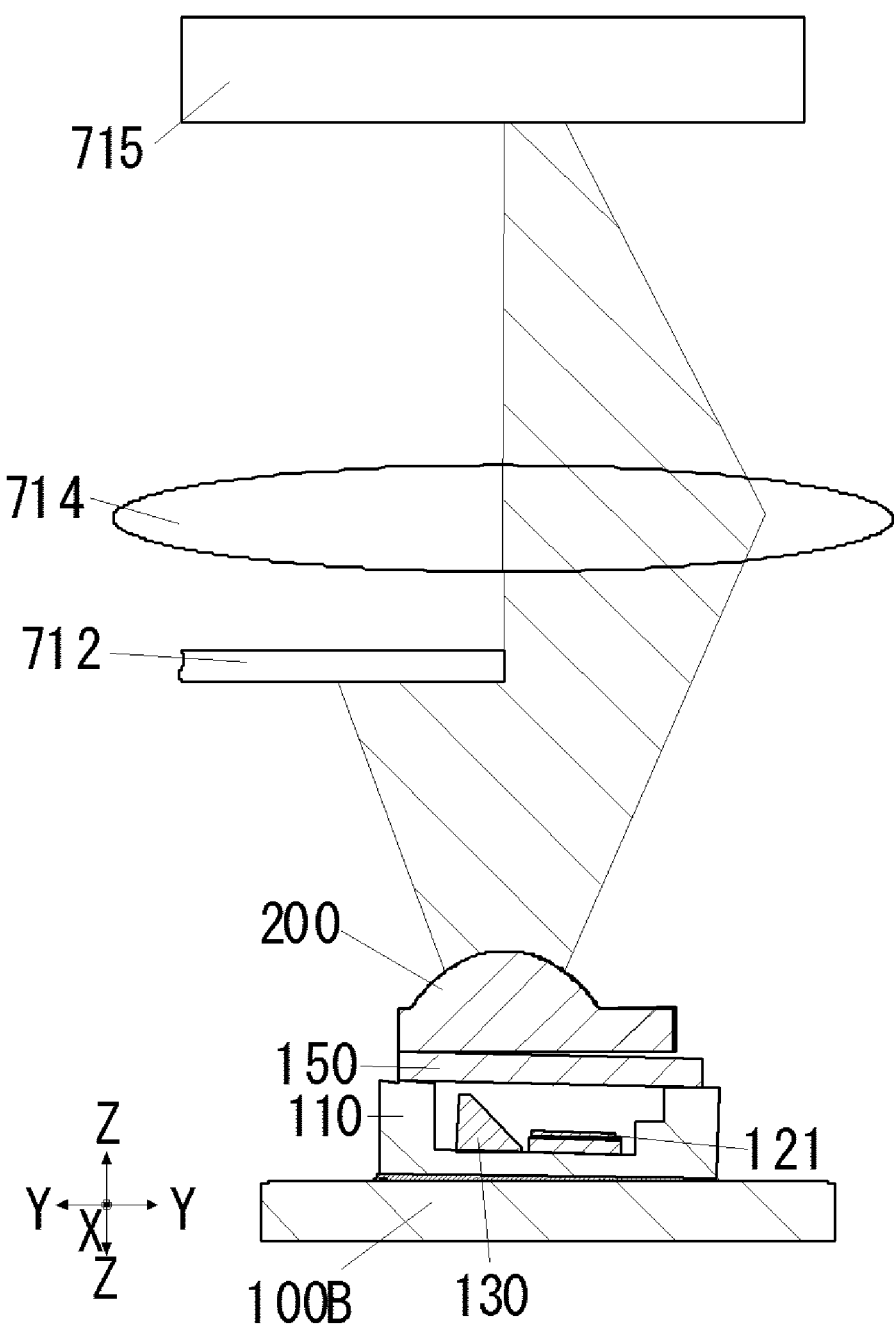
FIG. 14A is a diagram showing an optical path of light from a light emitting device in which a light source and an optical member has a distance shorter than the desired distance.
Figure 14B:
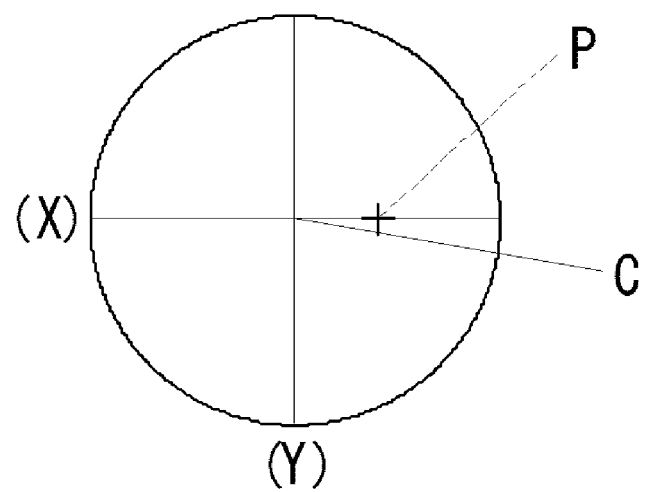
FIG. 14B is a schematic diagram of an image of light shown in FIG. 14A, acquired by a CCD image sensor.
Figure 15A:
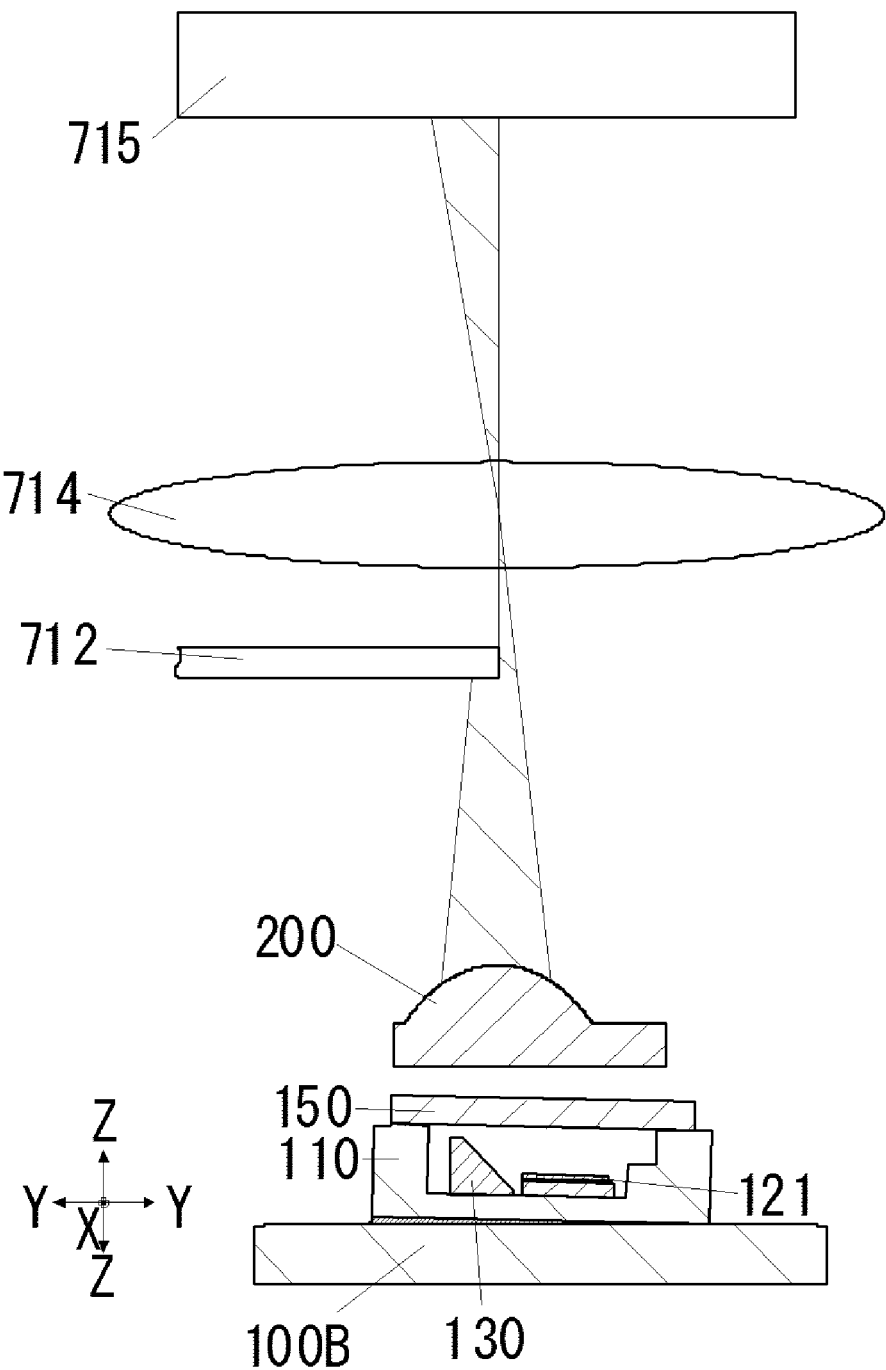
FIG. 15A is a diagram showing an optical path of light from a light emitting device in which a light source and an optical member has a distance longer than the desired distance.
Figure 15B:
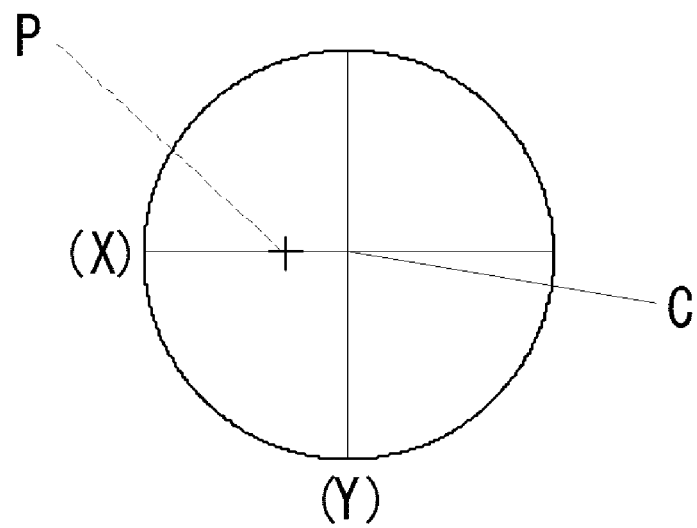
FIG. 15B is a schematic diagram of an image of light shown in FIG. 15A, acquired by a CCD image sensor.

More details thereof will be described below with reference to FIG. 13A to FIG. 15B. FIG. 13A, FIG. 14A, and FIG. 15A are schematic diagrams each illustrating spread of light, and FIG. 13B, FIG. 14B, and FIG. 15B are schematic diagrams each illustrating a result of photographing using a CCD image sensor. FIG. 13A, FIG. 14A, and FIG. 15A respectively correspond to FIG. 13B, FIG. 14B, and FIG. 15B. FIG. 13A and FIG. 13B illustrate a case in which the lens part is at a predetermined height such that light that has passed through the lens part is converted into collimated light. FIG. 14A and FIG. 14B illustrate a case in which the lens part is at a position lower than the predetermined height, and FIG. 15A and FIG. 15B illustrate a case in which the lens part is at a position higher than the predetermined height. To facilitate understanding, the stage 710, the support 711, the second light-shielding member 713, and the analyzing device 716 are not shown in FIG. 13A, FIG. 14A, and FIG. 15A, and for clarifying the course of light, FIG. 13A, FIG. 14A, and FIG. 15A illustrate views seen from the left side in FIG. 6A. In the present embodiment, the reference detection position C is set to a position of: (X coordinate, Y coordinate)=(0, 0).

When the lens part is at a desired height such that light that has passed through the lens part is converted into collimated light, the centroid of luminance is at the X, Y coordinates of (0, 0). Thus, as shown in FIG. 13B, the reference detection position C and the post-shielding detection position P match with each other. When the lens part is at a position lower than the desired height, as shown in FIG. 14A, light that has passed through the lens part spreads and is detected by the photodetector as it is not satisfactory condensed by the condensing lens 714. In this case, the X-coordinate of the centroid of luminance is larger than zero and for example shown in FIG. 14B, the post-shielding detection position P is on the right side of the reference detection position C. In this case, the deviation amount of the height of the lens part is determined from the deviation between the reference detection position C and post-shielding detection position P, and the height of the lens part is increased based on the deviation amount. When the lens part is at a position higher than the desired height, as shown in FIG. 15A, light that has passed through the lens part 200 is condensed and a portion of the light that is not shielded by the first light-shielding member 712 and that has passed through the condensing lens 714 is detected at a location overlapping with the first light-shielding member 712. In this case, the X-coordinate of the centroid of luminance is smaller than zero and for example shown in FIG. 15B, the post-shielding detection position P locates on the left side of the reference detection position C. Also, in this case, the deviation amount of the height of the lens part is determined from the deviation between the reference detection position P and post-shielding detection position C, and the height of the lens part is reduced based on the deviation amount.

In the present embodiment, light that has passed through each of the lens parts has a far field pattern in a shape elongated in one direction, and as shown in FIG. 6B, in a longitudinal direction of the elongated shape, a portion of light that has passed through each of the lens parts is shielded by the first light-shielding member 712. The far-filed pattern of a laser light emitted from each semiconductor laser element has a shape elongated in one direction, so that effect of spreading of light may be greater in the longitudinal direction of the elongated shape. That is, spreading of light in Y-direction is more apparent than spreading of light in X-direction in FIG. 6B. The spreading angle (divergence angle) in Y-direction is greater than the divergence angle in X-direction, such that shielding the light in Y-direction can facilitate adjusting the divergence angle. The term "far field pattern" in the present specification is obtained by measuring an optical intensity distribution of the light in a plane parallel to the light emitting surface and at a certain distance from the light emitting surface of semiconductor laser element, and determined as a shape corresponding to a certain optical intensity, for example, at $1/e^2$ of the peak intensity.

Adjusting Distance Between Light Source 100 and Optical Member 100: S6

Next, as shown in FIG. 7, based on the reference detection position and the post-shielding detection position, the distance between the light source 100 and the optical member 200 is adjusted such that the detection position of light after shielded by the first light-shielding member 712 and detected by the photodetector 715 approaches the reference detection position. More specifically, based on the difference between the reference detection position and the post-shielding detection position, the height of the lens part of the optical member 200 is adjusted such that the position of light that has passed through the lens part and detected by the photodetector 715 matches with the position of the reference detection position.

Figure 16:
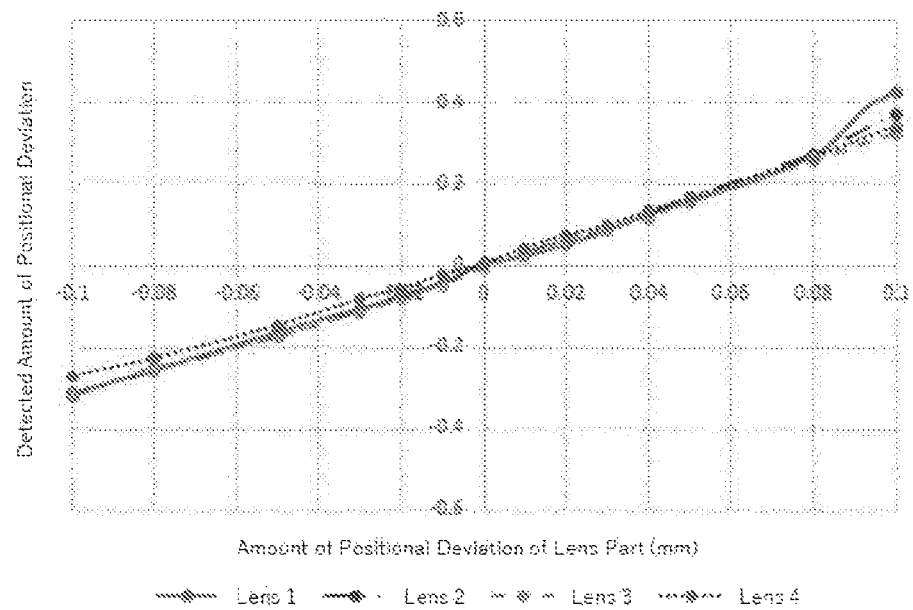
FIG. 16 is a graph illustrating positional deviation and adjusting amount of lens parts.

The adjustment of the heights of the lens parts of the optical member 200 can be performed based on a table prepared beforehand. Such a table can be created by determining the deviation amount of the optical member 200 based on the deviation amount between the reference detection position and the post-shielding detection position, and obtaining the adjusting amount of the height of the optical member 200. The height of each of the lens parts can be adjusted according to the table. FIG. 16 is a graph prepared based on a table of data that shows the deviation amounts (deviation amounts of the positions) at the reference detection positions and the post-shielding detection positions and the adjusting amounts of positions of the lens parts respectively corresponding to the deviation amounts (adjusting distances of the lens parts in Z-direction to obtain collimated light after passing through the lens parts. The graph of FIG. 16 shows the relationship between the deviation amounts of the detection positions and the deviation amounts of positions of the lens parts of the four lens parts (lens 1 to lens 4) included in a single optical member. The relationships between the deviation amounts of the detection position and adjustment amounts of the lens parts shown in FIG. 16 are similar to each other, indicating that the height of each of the lens parts can be adjusted individually based on the graph. To be more precise, the graph of FIG. 16 shows not only the adjustment amounts but also shows whether the heights of the lens parts to be increased or decreased.

With creating the table for each of the optical members 200, the heights of the lens parts can be more accurately adjusted. Individual difference in the optical members 200 produced under the same conditions may not be great and it is preferable to use the same table for the adjustments. Accordingly, time and labor required for the adjustment of the optical member 200 can be reduced, which can facilitate mass production of the light emitting device 300.

Next, as shown in FIG. 8, the reference detection position is determined at the third lens part 213. The reference detection position is determined in a similar manner as described above. At this time, the first light-shielding member 712 is disposed so as not to located directly above the lens parts. Then, the first light-shielding member 712 is moved as shown in FIG. 9, the reference detection position and the post-shielding detection position are determined, then based on the reference detection position and the post-shielding detection position, the distance between the light source 100 and the optical member 200 is adjusted such that the detection position of light after shielded by the first light-shielding member 712 approaches the reference detection position.

As described above, when two or more semiconductor laser elements arranged laterally in a row is used as the one or more semiconductor laser elements, and an optical member 200 including two or more lens parts arranged laterally in a row is used as the optical member including one or more lens parts, it is preferable to carry out the step of measuring the reference detection position and the step of measuring the post-shielding detection position at two lens parts located at a first end and a second end that is the opposite side of the first end in the two or more lens parts arranged laterally in a row. Accordingly, while reducing the time required for measuring, the divergence angle of light emitted from each of the lens parts can be made more similar to the predetermined divergence angle. Further, as in the present embodiment, when the second semiconductor laser element 122 has two light emitting points, the divergence angle of light is difficult to detect, so that the divergence angle is preferably detected by using a blue-light-emitting semiconductor laser element 121 and a green-light-emitting semiconductor laser element 123 each having a single light emitting point. Alternatively, determining the reference detection position and adjusting the height of the optical member 200 may be performed respectively for all the lens parts. In this case, while the lower surface of the light source 100 (i.e., the upper surface of the stage 710 on which the light source 100 is placed) and the lower surface of the optical member 200 are made in parallel to each other, the position of the optical member 200 is adjusted such that the height of the optical member 200 is at the average of the heights obtained for the lens parts.

In the present embodiment, at the first lens part 211, the determining of the reference detection position to the adjusting of the height of the optical member) 200 is performed, and then the same is performed at the third lens part. That is, determining the detection positions through adjusting the position are performed for one lens part corresponding to one semiconductor laser element, at a time. Accordingly, the amounts of deviation from the predetermined positions can be reduced at the second and succeeding lens parts, and thus can facilitate the adjustments. Alternatively, determining the reference detection position through determining the post-shielding detection position may be performed collectively for each of the lens parts that to be determined, and thereafter the distances between the light source 100 and the optical member 200 may be adjusted. In this case, the distances between the light source 100 and the optical member 200 can be collectively adjusted, thus the processing time can be reduced.

When the measuring is performed for two or more lens parts, it is preferable to also adjust the inclination angle of the optical member 200. More specifically, the inclination angle of the optical member 200 is preferably adjusted such that light from each of the lens parts is at a desired height. This arrangement can facilitate obtaining of a desired divergence angle of light from each of the semiconductor laser elements.

Securing Optical Member 200: S7

Next, the optical member 200 is secured to the light source 100 at the adjusted position. In the example shown in the first embodiment, the optical member 200 is secured by using a photocurable adhesive 160 to four corners of the light source 100.

Second Embodiment

Figure 17:
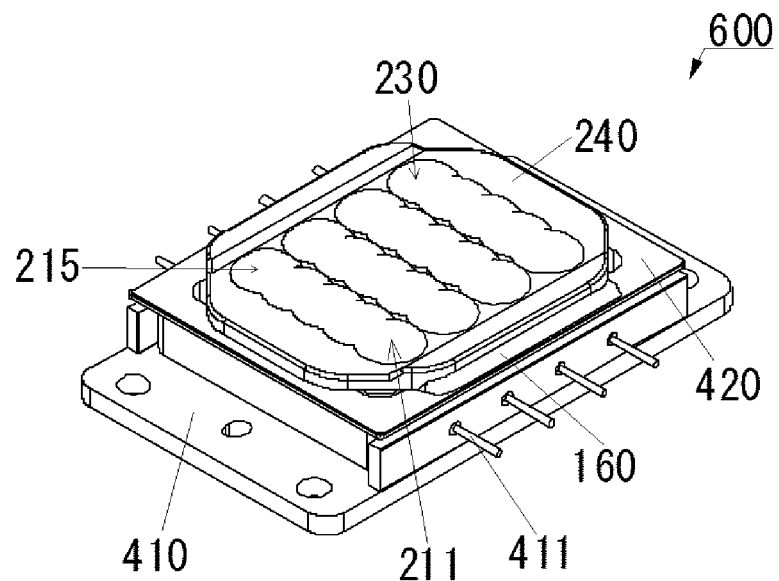
FIG. 17 is a schematic perspective view of a light emitting device produced by a method of manufacturing according to a second embodiment.
Figure 18:
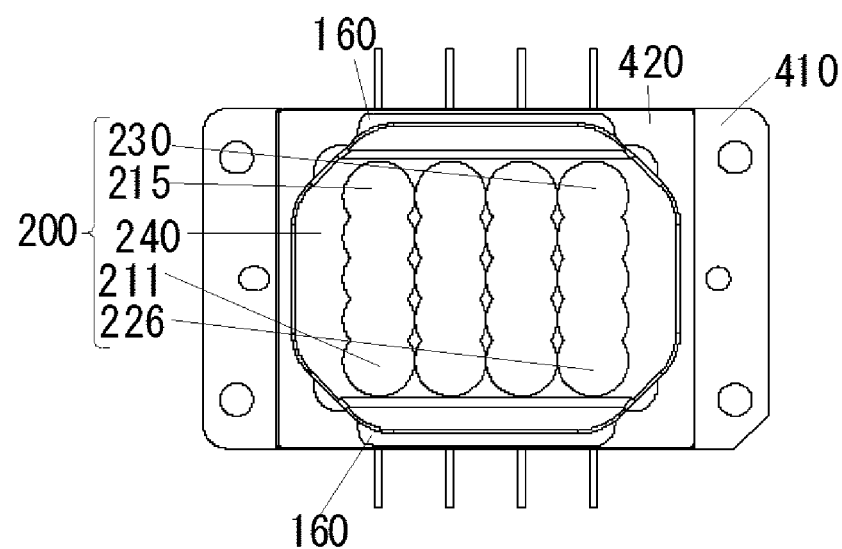
FIG. 18 is a schematic top view of the light emitting device shown in FIG. 17.
Figure 19:
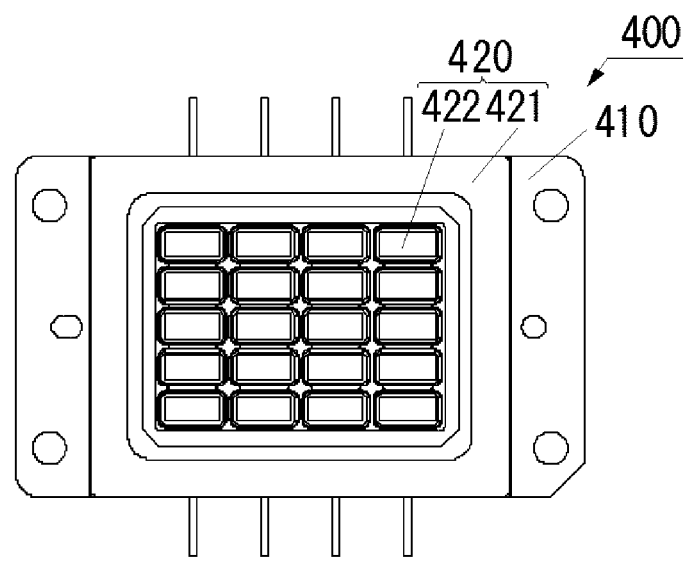
FIG. 19 is a schematic top view of a light source according to the second embodiment.
Figure 20:
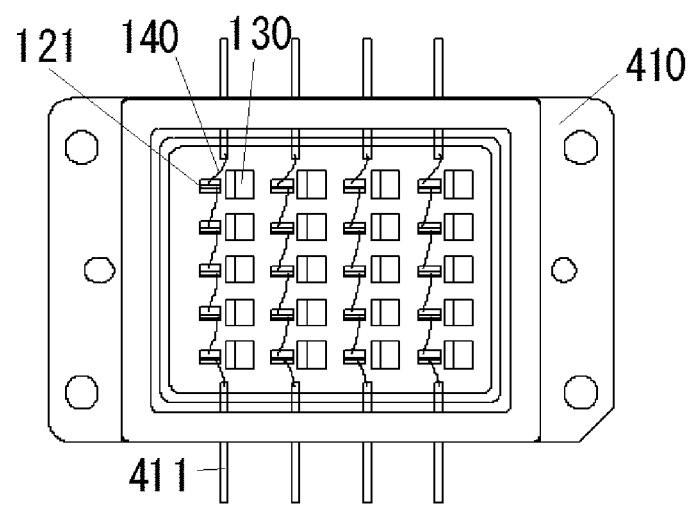
FIG. 20 is a schematic top view of the light source shown in FIG. 19, illustrating a state in which a cover has been removed.
Figure 23B:
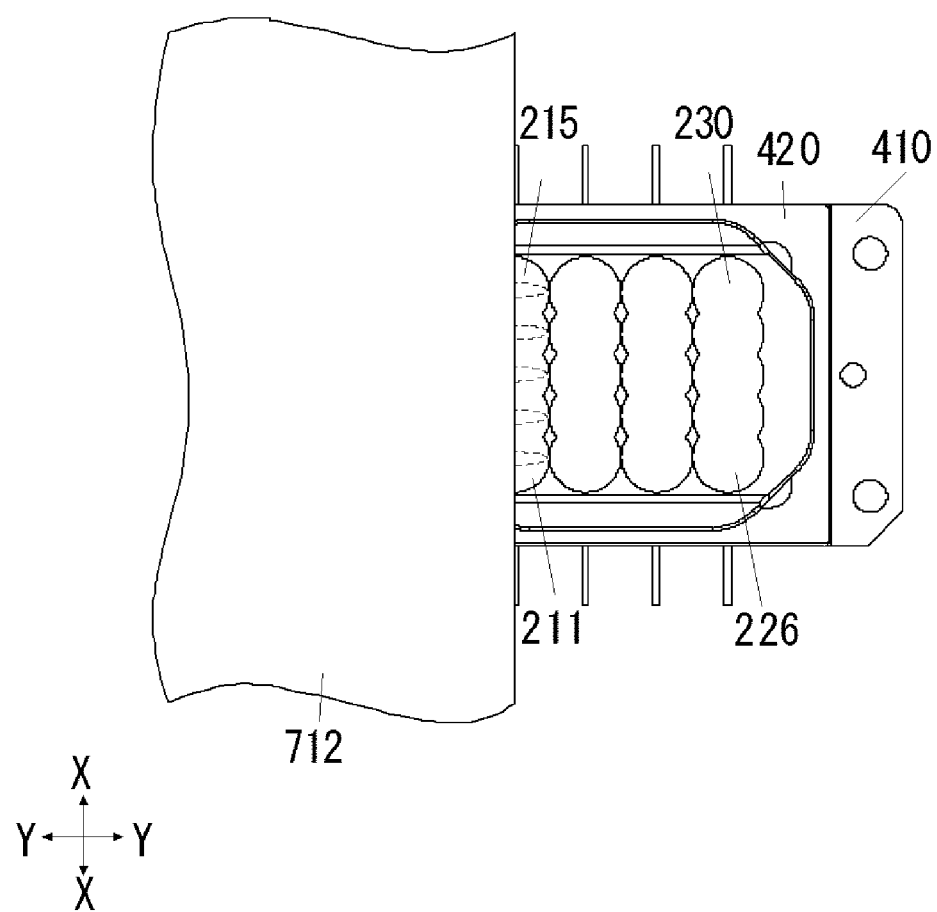
FIG. 23B is a schematic top view of the light source, the optical member, and the first light-shielding member shown in FIG. 23A, viewed from above.
Figure 24:
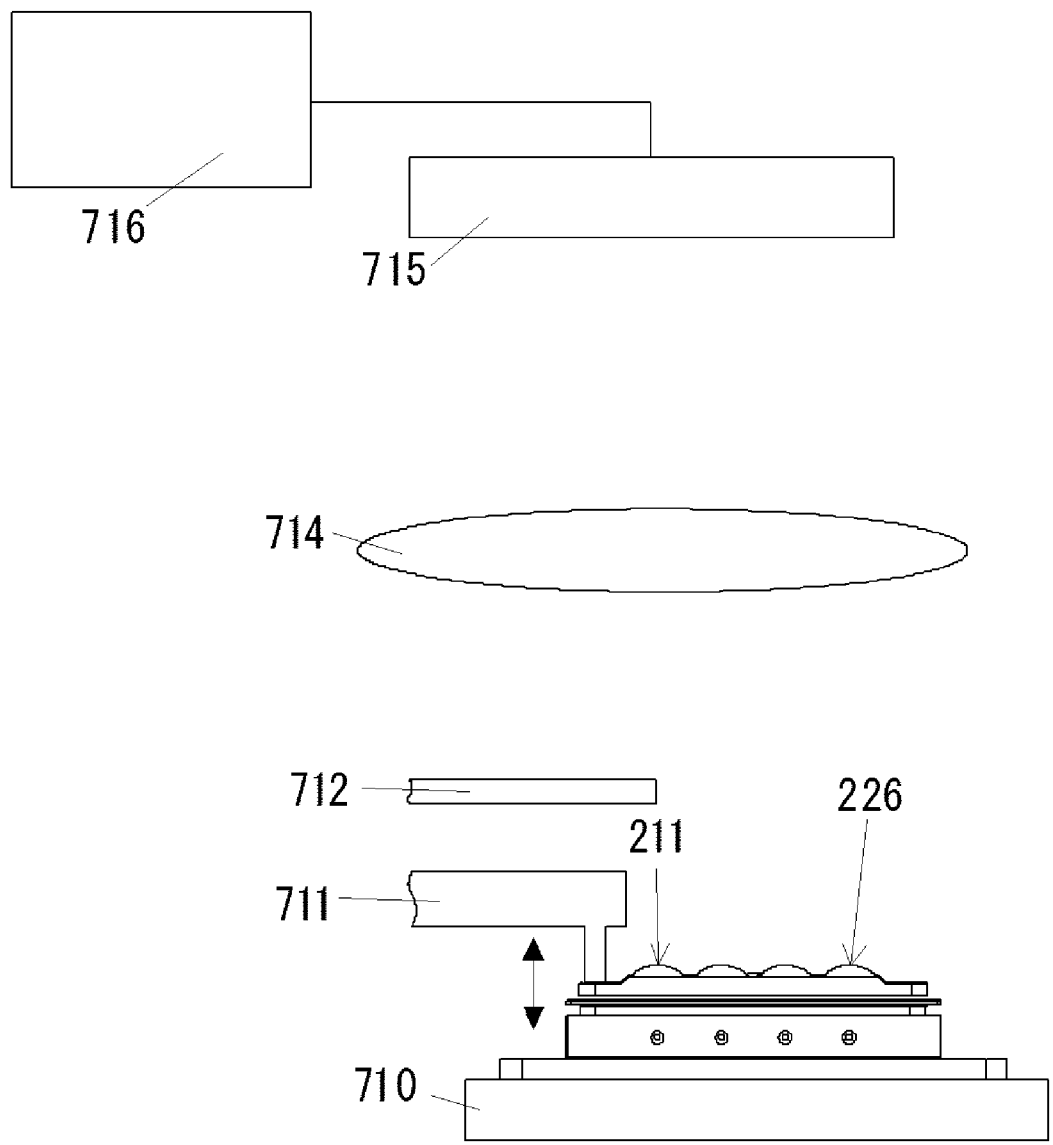
FIG. 24 is a diagram illustrating a method of manufacturing a light emitting device according to the second embodiment.

FIG. 17 is a schematic perspective view of a light emitting device 600 produced by a method of manufacturing according to a second embodiment, and FIG. 18 is a schematic top view of the light emitting device 600. FIG. 19 is a schematic top view of a light source 400, and FIG. 20 is a diagram illustrating constituent members in the recess of the base 410. The method of manufacturing the light emitting device 600 is substantially similar to those described in the first embodiment except for those described below.

In the step of providing light source, the light source 400 which does not include a mounting substrate is provided. The base 410 includes a metal material such as copper, iron, or the like. As shown in FIG. 20, twenty semiconductor laser elements are disposed in the recess of the base 410. The semiconductor laser element 121 is a blue semiconductor laser element including a GaN-based semiconductor. Further, twenty light-reflecting parts 130 are disposed in the recess of the base 410, each corresponding to a respective one of the semiconductor laser elements. Further, as shown in FIG. 19, a cover including a support 421 made of a metal and a light-transmissive part 422 made of glass is disposed. In the present embodiment, the cover 420 includes the light-transmissive parts 422 with a number corresponding to the number of the semiconductor laser elements (i.e., corresponding to the number of lights from the semiconductor laser elements), but alternatively, a single light-transmissive part 422 may be employed. The base 410 and the cover 420 are secured by welding, and therefore, a space defined by the base 410 and the cover 420 is a hermetically sealed space.

Further, in the step of disposing an optical member (member) (S2), an optical measuring system that does not have the second light-shielding member 713 is used. However, in the present embodiment, an optical measuring system provided with the second light-shielding member may also be used for the adjustment.

In the step of measuring the reference detection position (S3), light that has passed through a single lens part is detected while causing a plurality of semiconductor laser elements connected to (one of) the lead pin(s) in series to emit light.

Then, as shown in FIG. 21 to FIG. 24, the determining of the reference detection position through the adjusting of the distance between the first lens part 211 and the light source 400 are performed at the first lens part 211, and then the same is performed at the fifth lens part 215 and the twentieth lens part 230. Then, the inclination angle of the optical member (member) 200 is adjusted to obtain the predetermined heights measured at the first lens part 211, the fifth lens part 215, and the twentieth lens part 230, as shown in FIG. 25. In FIG. 25, adjusting of the inclination in Y-direction is illustrated, but adjusting of the inclination in X-direction is also performed. Accordingly, the divergence angle of light emitted from each of the lens parts can be made more similar to desired divergence angle. Then, as shown in FIG. 20, the optical member 200 is secured to the base 410 by using an adhesive 160. The adhesive 160 is provided at two opposite sides at the periphery of the optical member 200 as shown in the top view of FIG. 18.

As described above, when two or more semiconductor laser elements arranged laterally in a row is used as the one or more semiconductor laser elements, and as the optical member 200 shown in FIG. 17, an optical member 200 including two or more lens parts arranged laterally in a row is used as the optical member 200 including one or more lens parts, it is preferable to carry out the step of determining the reference detection position and the step of determining the post-shielding detection position at two lens parts located at a first end and a second end that is the opposite side of the first end in the two or more lens parts arranged laterally in a row. Accordingly, when adjusting the inclination angles of the lens parts, the divergence angle of light emitted from each of the lens parts can be made more similar to the predetermined divergence angle.

The light emitting devices obtained by the method of manufacturing according to each embodiment can be used, for example, for projectors.

It is to be understood that although the present invention has been described with regard to preferred embodiments thereof, various other embodiments and variants may occur to those skilled in the art that are within the scope and spirit of the invention, and such other embodiments and variants are intended to be covered by the following claims.

What is claimed is:

1. A method of manufacturing a light emitting device, the method comprising:
   providing a light source comprising one or more semiconductor laser elements configured to emit light, the one or more semiconductor laser elements comprising a first semiconductor laser element;
   locating an optical member above the light source, the optical member comprising one or more lens parts, each corresponding to a respective one of the one or more semiconductor laser elements, the one or more lens parts comprising a first lens part corresponding to the first semiconductor laser element;
   locating a condensing lens above the optical member;
   locating a photodetector above the optical member;
   causing at least the first semiconductor laser element to emit light through the first lens part, such that the light that has been emitted from the first semiconductor laser element and that has passed through the first lens part has a far field pattern with an elongated shape;

detecting, using the photodetector, light that has been emitted from the first semiconductor laser element and that has passed through the first lens part and the condensing lens;

determining a reference detection position of the light detected by the photodetector;

locating a first light-shielding member between the optical member and the condensing lens;

shielding, by the first light-shielding member, only a portion of light that has passed through the first lens part, in a longitudinal direction of the elongated shape of the far field pattern;

detecting, using the photodetector, a remaining portion of light that has passed through the first lens part, passed the light-shielding member, and passed through the condensing lens; and determining a post-shielding detection position of the remaining portion of light detected by the photodetector;

based on the reference detection position and the post-shielding detection position, adjusting a distance between the light source and the optical member such that, when the remaining portion of light is detected by the photodetector to obtain a third detection position, the third detection position approaches or coincides with the reference detection position; and securing the optical member and the light source to each other using a photocurable adhesive.

2. The light emitting device according to claim 1, wherein, in the step of determining the post-shielding detection position, the post-shielding detection position coincides with a centroid of luminance distribution.

3. The method of manufacturing a light emitting device according to claim 2, wherein, in the step of locating the first light-shielding member, the first light-shielding member is located so as to shield light that has passed through half or more of the first lens part.

4. The method of manufacturing a light emitting device according to claim 3, wherein:
the one or more semiconductor laser elements comprise two or more semiconductor laser elements arranged in a single row,
the one or more lens parts of the optical member comprise two or more lens parts arranged in a single row, and
the step of determining the reference detection position and the step of determining the post-shielding detection position are performed at two lens parts respectively located at a first end and a second end of the single row of the two or more lens parts.

5. The method of manufacturing a light emitting device according to claim 3, wherein:
the one or more semiconductor laser elements comprise four or more semiconductor laser elements disposed in an array of two or more rows and two or more columns, and
the one or more lens parts comprise four or more lens parts disposed in two or more rows and two or more columns, and
the step of determining the reference detection position and the step of determining the post-shielding detection position are performed for at least three of four lens parts respectively located at four corners of the array of four or more lens parts.

6. The method of manufacturing a light emitting device according to claim 2, wherein:
the one or more semiconductor laser elements comprise two or more semiconductor laser elements arranged in a single row,
the one or more lens parts of the optical member comprise two or more lens parts arranged in a single row, and
the step of determining the reference detection position and the step of determining the post-shielding detection position are performed at two lens parts respectively located at a first end and a second end of the single row of the two or more lens parts.

7. The method of manufacturing a light emitting device according to claim 2, wherein:
the one or more semiconductor laser elements comprise four or more semiconductor laser elements disposed in an array of two or more rows and two or more columns, and
the one or more lens parts comprise four or more lens parts disposed in two or more rows and two or more columns, and
the step of determining the reference detection position and the step of determining the post-shielding detection position are performed for at least three of four lens parts respectively located at four corners of the array of four or more lens parts.

8. The method of manufacturing a light emitting device according to claim 1, wherein, in the step of locating the first light-shielding member, the first light-shielding member is located so as to shield light that has passed through half or more of the first lens part.

9. The method of manufacturing a light emitting device according to claim 1, further comprising, after determining the reference detection position, adjusting a position of the optical member in a plane direction such that the reference detection position acquired by the photodetector coincides with a predetermined position.

10. The method of manufacturing a light emitting device according to claim 1, wherein:
the one or more semiconductor laser elements comprise two or more semiconductor laser elements arranged in a single row,
the one or more lens parts of the optical member comprise two or more lens parts arranged in a single row, and
the step of determining the reference detection position and the step of determining the post-shielding detection position are performed at two lens parts respectively located at a first end and a second end of the single row of the two or more lens parts.

11. The method of manufacturing a light emitting device according to claim 1, wherein:
the one or more semiconductor laser elements comprise four or more semiconductor laser elements disposed in an array of two or more rows and two or more columns, and
the one or more lens parts comprise four or more lens parts disposed in two or more rows and two or more columns, and
the step of determining the reference detection position and the step of determining the post-shielding detection position are performed for at least three of four lens parts respectively located at four corners of the array of four or more lens parts.

12. The method of manufacturing a light emitting device according to claim 1, wherein in the step of determining the reference detection position and in the step of determining the post-shielding detection position, a second light-shielding member defining a through-opening to allow passage of light that has passed through one of the lens parts is placed above the optical member, and detection positions of light that has passed through the through-opening are determined respectively.

13. A method of manufacturing a light emitting device, the method comprising:
providing a light source comprising two or more semiconductor laser elements configured to emit light and arranged in a single row, the two or more semiconductor laser elements comprising a first semiconductor laser element;
locating an optical member above the light source, the optical member comprising two or more lens parts arranged in a single row, each corresponding to a respective one of the two or more semiconductor laser elements, the two or more lens parts comprising a first lens part corresponding to the first semiconductor laser element;
locating a condensing lens above the optical member;
locating a photodetector above the optical member;
causing at least the first semiconductor laser element to emit light;
detecting, using the photodetector, light that has been emitted from the first semiconductor laser element and that has passed through the first lens part and the condensing lens;
determining a reference detection position of the light detected by the photodetector;
locating a first light-shielding member between the optical member and the condensing lens;
shielding, by the first light-shielding member, a portion of light that has passed through the first lens part;
detecting, using the photodetector, a remaining portion of light that has passed through the first lens part, the light-shielding member, and the condensing lens; and
determining a post-shielding detection position of the remaining portion of light detected by the photodetector;
based on the reference detection position and the post-shielding detection position, adjusting a distance between the light source and the optical member such that, when the remaining portion of light is detected by the photodetector to obtain a third detection position, the third detection position approaches or coincides with the reference detection position; and
securing the optical member and the light source to each other,
wherein the step of determining the reference detection position and the step of determining the post-shielding detection position are performed at two lens parts respectively located at a first end and a second end of the single row of the two or more lens parts.

14. A method of manufacturing a light emitting device, the method comprising:
providing a light source comprising four or more semiconductor laser elements configured to emit light and disposed in an array of two or more rows and two or more columns, the four or more semiconductor laser elements comprising a first semiconductor laser element;
locating an optical member above the light source, the optical member comprising four or more lens parts disposed in two or more rows and two or more columns, each corresponding to a respective one of the four or more semiconductor laser elements, the four or more lens parts comprising a first lens part corresponding to the first semiconductor laser element;
locating a condensing lens above the optical member;
locating a photodetector above the optical member;
causing at least the first semiconductor laser element to emit light;
detecting, using the photodetector, light that has been emitted from the first semiconductor laser element and that has passed through the first lens part and the condensing lens;
determining a reference detection position of the light detected by the photodetector;
locating a first light-shielding member between the optical member and the condensing lens;
shielding, by the first light-shielding member, a portion of light that has passed through the first lens part;
detecting, using the photodetector, a remaining portion of light that has passed through the first lens part, the light-shielding member, and the condensing lens; and
determining a post-shielding detection position of the remaining portion of light detected by the photodetector;
based on the reference detection position and the post-shielding detection position, adjusting a distance between the light source and the optical member such that, when the remaining portion of light is detected by the photodetector to obtain a third detection position, the third detection position approaches or coincides with the reference detection position; and
securing the optical member and the light source to each other,
wherein the step of determining the reference detection position and the step of determining the post-shielding detection position are performed for at least three of four lens parts respectively located at four corners of the array of four or more lens parts.

* * * * *